US011733757B2

(12) United States Patent
Naveh et al.

(10) Patent No.: US 11,733,757 B2
(45) Date of Patent: Aug. 22, 2023

(54) HIERARCHICAL POWER MANAGEMENT ARCHITECTURE FOR SOC-BASED ELECTRONIC DEVICES

(71) Applicant: Nuvia, Inc., San Diego, CA (US)

(72) Inventors: Alon Naveh, Corte Madera, CA (US); Anubhav Mishra, Fremont, CA (US); Manu Gulati, Saratoga, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/701,552

(22) Filed: Mar. 22, 2022

(65) Prior Publication Data

US 2022/0413582 A1    Dec. 29, 2022

Related U.S. Application Data

(60) Provisional application No. 63/215,355, filed on Jun. 25, 2021, provisional application No. 63/215,351, filed on Jun. 25, 2021.

(51) Int. Cl.
| | |
|---|---|
| *G06F 1/32* | (2019.01) |
| *G06F 1/3206* | (2019.01) |
| *G06F 1/324* | (2019.01) |
| *G06F 11/30* | (2006.01) |
| *G06F 1/3296* | (2019.01) |

(Continued)

(52) U.S. Cl.
CPC ........... *G06F 1/3206* (2013.01); *G06F 1/324* (2013.01); *G06F 1/3275* (2013.01); *G06F 1/3296* (2013.01); *G06F 11/3058* (2013.01); *G06F 11/3075* (2013.01); *G06F 15/7807* (2013.01)

(58) Field of Classification Search
CPC ..... G06F 1/3206; G06F 1/3275; G06F 1/3296
See application file for complete search history.

(56) References Cited

U.S. PATENT DOCUMENTS

| | | |
|---|---|---|
| 7,337,339 B1 | 2/2008 | Choquette et al. |
| 9,477,280 B1 * | 10/2016 | Gangwar .............. G06F 1/3296 |

(Continued)

OTHER PUBLICATIONS

International Search Report and Written Opinion for International Patent Application No. PCT/US2022/072871, dated Oct. 5, 2022, 17 pages.

*Primary Examiner* — Stefan Stoynov
(74) *Attorney, Agent, or Firm* — W&T Qualcomm Incorporated

(57) ABSTRACT

An electronic system has a plurality of power domains, and each domain includes a subset of one or more processor clusters, first memory, PMIC, and second memory. A plurality of power sensors are distributed on the electronic system and configured to collect a plurality of power samples from the power domains. A power management engine is configured to process the power samples based on locations of the corresponding power sensors to generate one or more power profiles and a plurality of power throttling thresholds. The power manage engine is configured to implement a global power control operation by determining power budgets of the power domains on a firmware level and enabling operations of the power domains accordingly. The power manage engine is also configured to enable a plurality of local power control operations to be directly implemented on the power domains based on the power throttling thresholds.

19 Claims, 8 Drawing Sheets

(51) Int. Cl.
*G06F 1/3234* (2019.01)
*G06F 15/78* (2006.01)

(56) References Cited

U.S. PATENT DOCUMENTS

| | | |
|---|---|---|
| 2006/0161794 A1 | 7/2006 | Chiasson et al. |
| 2007/0124618 A1 | 5/2007 | Aguilar et al. |
| 2010/0073068 A1 | 3/2010 | Cho et al. |
| 2012/0072743 A1* | 3/2012 | Lee .................. G06F 1/3287 713/300 |
| 2013/0061064 A1 | 3/2013 | Ananthakrishnan et al. |
| 2013/0080803 A1 | 3/2013 | Ananthakrishnan et al. |
| 2013/0311796 A1 | 11/2013 | Brinks et al. |
| 2014/0181545 A1 | 6/2014 | Shrall et al. |
| 2016/0026231 A1 | 1/2016 | Ignowski et al. |
| 2016/0070327 A1 | 3/2016 | Nemani et al. |
| 2017/0123467 A1 | 5/2017 | Ignowski et al. |
| 2019/0041969 A1 | 2/2019 | Nge et al. |
| 2020/0125148 A1 | 4/2020 | Lee et al. |
| 2020/0301490 A1 | 9/2020 | Thomas et al. |
| 2021/0247825 A1* | 8/2021 | Kelemen .................. H02J 1/14 |
| 2022/0413581 A1 | 12/2022 | Naveh |

* cited by examiner

HIERARCHICAL POWER MANAGEMENT ARCHITECTURE FOR SOC-BASED ELECTRONIC DEVICES

RELATED APPLICATIONS

This application claims priority to U.S. Provisional Patent Application No. 63/215,355, titled "Dynamic Power Management for SoC-based Electronic Devices," filed on Jun. 25, 2021, and U.S. Provisional Patent Application No. 63/215,351, titled "Hierarchical Power Management Architecture for SoC-based Electronic Devices," filed on Jun. 25, 2021, each of which is hereby incorporated by reference in its entirety.

TECHNICAL FIELD

This application relates generally to power management of an electronic device (e.g., having a system on a chip (SoC)), particularly to methods, systems, and non-transitory computer-readable media for monitoring and controlling power consumption and device performance of an SoC-based electronic device.

BACKGROUND

An electronic device oftentimes integrates a system on a chip (SoC) with a power management integrated circuit (PMIC), communication ports, external memory or storage, and other peripheral function modules on a main logic board. The SoC includes one or more microprocessor or central processing unit (CPU) cores, memory, input/output ports, and secondary storage in a single package. The PMIC is typically disposed adjacent to the SoC on the main logic board and provides multiple direct current (DC) power supply rails to the SoC via conductive wires formed on the main logic board. The PMIC provides a plurality of power rails configured to drive operations of the SoC. Power characteristics (e.g., power consumption, current, and voltage) are monitored and controlled for each power rail and a corresponding portion of the SOC. It would be beneficial to have a more efficient and flexible power management mechanism than the current practice.

SUMMARY

To address power management issues of an SoC-based electronic device, it would be highly desirable to provide a semiconductor device or system with a plurality of distributed power sensors and a power management engine in addition to a plurality of processor clusters, cluster memory or cache, PMIC, and system memory. Various implementations of systems, methods and devices within the scope of the appended claims each have several aspects, no single one of which is solely responsible for the attributes described herein. Without limiting the scope of the appended claims, after considering this disclosure, and particularly after considering the section entitled "Detailed Description" one will understand how the aspects of various implementations are used to provide a semiconductor device with a dynamic power management hierarchy configured to control power management of the semiconductor device at a desirable control rate from a firmware level and/or a hardware level. Specifically, the power management engine is configured to collect power samples from the distributed power sensors, generate power profiles and power throttling thresholds from the power samples, implement a global firmware-level power control operation by determining power budgets among different power domains and enabling global and local hardware-level power control operations (e.g., a local throttling action) on the different power domains.

In this application, "power" may broadly refer to any power-related characteristics. For example, power samples include temperatures, power consumptions, current values, or a combination thereof, and power sensors include any of temperature, power consumption, and current sensors. Power profiles can be any of temperature, power consumption, and current profiles. Power control operations are applied to control temperature, power consumption, or current profiles.

In one aspect, a power management method is implemented at a processor system having a plurality of domains. The method includes collecting a plurality of power samples from the plurality of domains over a time duration, wherein each power sample includes at least one of temperature, power consumption, and current values associated with a respective domain. The method further includes combining a subset of the plurality of power samples of the plurality of domains to generate a system temperature profile including a plurality of system temperature values and determining whether the system temperature profile satisfies a first criterion. The method further includes in accordance with a determination that the system temperature profile satisfies the first criterion at a first time, at a predefined controlling frequency, in real time, determining whether a respective system temperature value of the system temperature profile satisfies a second criterion or a third criterion. The method further includes in accordance with a determination that the respective system temperature value satisfies a second criterion, determining power budgets of the plurality of domains on a firmware level and enabling operations of the plurality of domains according to the power budgets. The method further includes in accordance with a determination that the respective system temperature value satisfies a third criterion, selecting a subset of domains and applying a respective power throttling action to each of the subset of domains directly on a hardware level.

In another aspect, a power management method is implemented at a processor system having a plurality of domains. The method includes collecting a plurality of power samples from the plurality of domains over a time duration, and each power sample includes at least one or temperature, power consumption, and current values associated with a respective domain. The method further includes combining a subset of the plurality of power samples of the plurality of domains to generate a system power profile including a plurality of system power values and determining whether the system power profile satisfies a first criterion. The method further includes, in accordance with a determination that the system power profile satisfies the first criterion at a first time, at a predefined controlling frequency, in real time, determining whether a respective system power value of the system power profile satisfies a second criterion or a third criterion. The method further includes, in accordance with a determination that the respective system power value satisfies the second criterion, determining power budgets of the plurality of domains on a firmware level and enabling operations of the plurality of domains according to the power budgets. The method further includes, in accordance with a determination that the respective system power value satisfies the third criterion, selecting a subset of domains and applying a respective power throttling action to each of the subset of domains on a hardware level.

In yet another aspect, an electronic system includes one or more processor clusters, first memory (e.g., a cache 208 in FIG. 2), power management integrated circuit (PMIC), and second memory (e.g., memory 104 in FIG. 2). A plurality of power sensors is distributed on the electronic system and configured to collect or preprocess a plurality of power samples from a plurality of power domains. Each power sample includes at least one of temperature, power consumption, and current values associated with a respective power domain. A power management engine is coupled to the plurality of power sensors and configured to receive the plurality of power samples from the plurality of power domains and process the power samples based on locations of the corresponding power sensors to generate one or more power profiles and a plurality of power throttling thresholds. The power management engine is configured to implement a global power control operation having a first rate based on the one or more power profiles by determining power budgets of a plurality of power domains on a firmware level and enabling operations of the plurality of power domains according to the power budgets. The power management engine is also configured to based on the one or more power profiles, enable the plurality of power domains to implement a plurality of local power control operations based on the plurality of power throttling thresholds on a hardware level. The local power control operations have second rates greater than the first rate.

These illustrative embodiments and implementations are mentioned not to limit or define the disclosure, but to provide examples to aid understanding thereof. Additional embodiments are discussed in the Detailed Description, and further description is provided there. Other implementations and advantages may be apparent to those skilled in the art in light of the descriptions and drawings in this specification.

Figure 1:
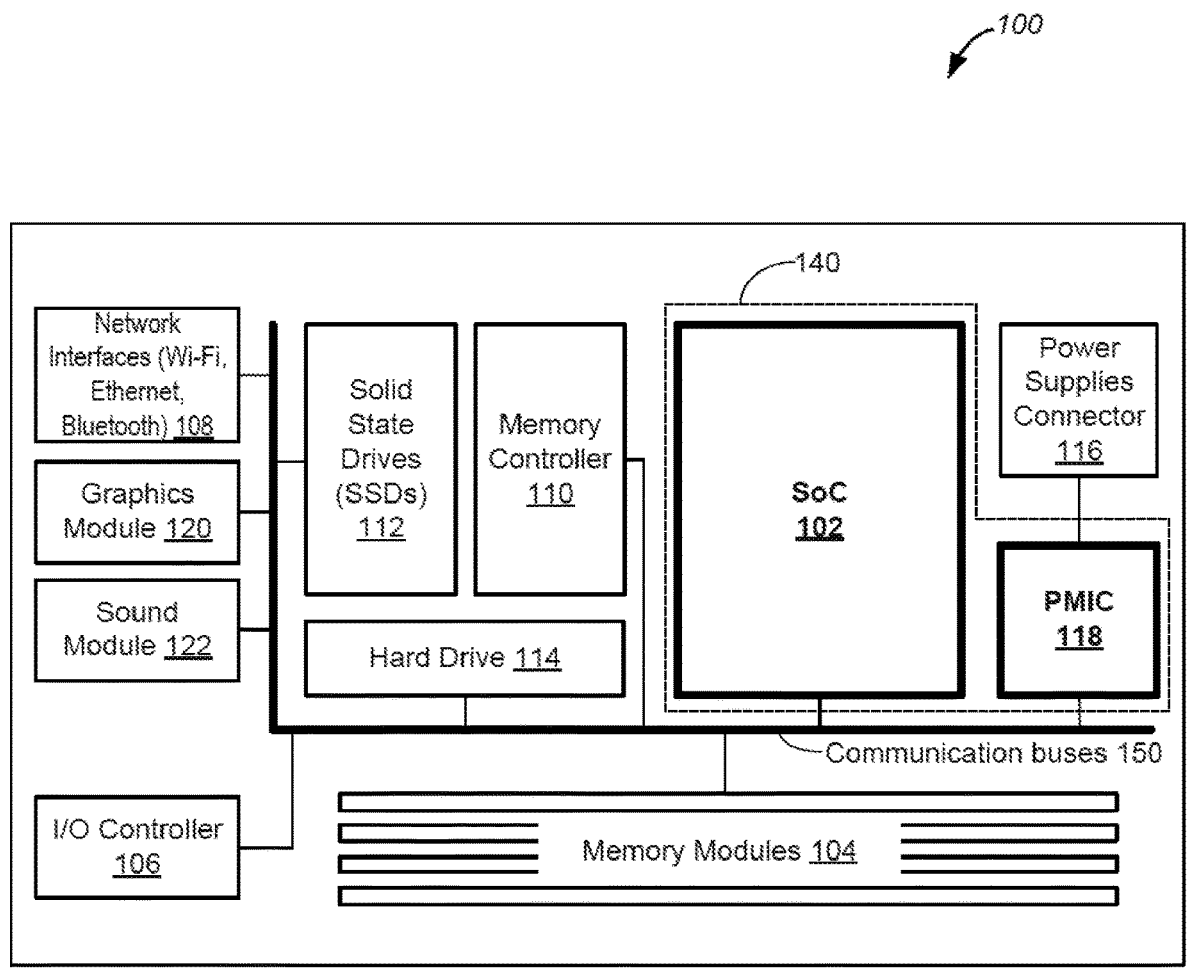
FIG. 1 is a block diagram of an example system module in a typical electronic device, in accordance with some implementations.

For a better understanding of the various described implementations, reference should be made to the Detailed Description below, in conjunction with the following drawings in which like reference numerals refer to corresponding parts throughout the figures. Like reference numerals refer to corresponding parts throughout the drawings.

DESCRIPTION OF IMPLEMENTATIONS

Reference will now be made in detail to specific embodiments, examples of which are illustrated in the accompanying drawings. In the following detailed description, numerous non-limiting specific details are set forth in order to assist in understanding the subject matter presented herein. But it will be apparent to one of ordinary skill in the art that various alternatives may be used without departing from the scope of claims and the subject matter may be practiced without these specific details.

Various embodiments of this application are directed to a dynamic power management hierarchy configured to control power management of a semiconductor device (e.g., an SoC) at a desirable control rate from a firmware level and/or a hardware level. Specifically, the power management engine is configured to collect power samples from the distributed power sensors, generate power profiles and power throttling thresholds from the power samples, implement a global firmware-level power control operation by determining power budgets among different power domains and enabling global and local hardware-level power control operations (e.g., a local throttling action) on the different power domains. Compared with such a dynamic power management hierarchy, existing solutions monitor and control power characteristics (e.g., power consumption, current, and voltage) for each power rail and a corresponding portion of the SOC. The dynamic power management hierarchy offers a more efficient and flexible power management mechanism.

FIG. 1 is a block diagram of an example system module 100 in a typical electronic device, in accordance with some implementations. System module 100 in this electronic device includes at least a system on a chip (SoC) 102 having one or more processors, memory modules 104 for storing programs, instructions and data, an input/output (I/O) controller 106, one or more communication interfaces such as network interfaces 108, and one or more communication buses 150 for interconnecting these components. In some implementations, I/O controller 106 allows SoC 102 to communicate with an I/O device (e.g., a keyboard, a mouse or a touch screen) via a universal serial bus interface. In some implementations, network interfaces 108 include one or more interfaces for Wi-Fi, Ethernet and Bluetooth networks, each allowing the electronic device to exchange data with an external source, e.g., a server or another electronic device. In some implementations, communication buses 150 include circuitry (sometimes called a chipset) that interconnects and controls communications among various system components included in system module 100.

In some implementations, memory modules 104 include high-speed random access memory, such as DRAM, SRAM, DDR RAM or other random access solid state memory devices. In some implementations, memory modules 104 include non-volatile memory, such as one or more magnetic disk storage devices, optical disk storage devices, flash memory devices, or other non-volatile solid-state storage devices. In some implementations, memory modules 104, or alternatively the non-volatile memory device(s) within memory modules 104, include a non-transitory computer readable storage medium. In some implementations, memory slots are reserved on system module 100 for receiving memory modules 104. Once inserted into the memory slots, memory modules 104 are integrated into system module 100.

In some implementations, system module 100 further includes one or more components selected from:
- a memory controller 110 that controls communication between SoC 102 and memory components, including memory modules 104, in electronic device;
- solid-state drives (SSDs) 112 that apply integrated circuit assemblies to store data in the electronic device, and in many implementations, are based on NAND or NOR memory configurations;
- a hard drive 114 that is a conventional data storage device used for storing and retrieving digital information based on electromechanical magnetic disks;
- a power supply connector 116 that includes one or more direct current (DC) power supply interfaces each of which is configured to receive a distinct DC supply voltage;
- power management integrated circuit (PMIC) 118 that modulates the distinct DC supply voltages received via the DC power supply interfaces to other desired internal supply voltages, e.g., 5V, 3.3V or 1.8V, as required by various components or circuits (e.g., processor cores in the SoC 102) within electronic device;
- a graphics module 120 that generates a feed of output images to one or more display devices according to their desirable image/video formats; and a sound module 122 that facilitates the input and output of audio signals to and from the electronic device under control of computer programs.

It is noted that communication buses 150 also interconnect and control communications among various system components including components 110-122.

One skilled in the art knows that other non-transitory computer readable storage media can be used, as new data storage technologies are developed for storing information in the non-transitory computer readable storage media in the memory modules 104 and in SSDs 112. These new non-transitory computer readable storage media include, but are not limited to, those manufactured from biological materials, nanowires, carbon nanotubes and individual molecules, even though the respective data storage technologies are currently under development and yet to be commercialized.

In some implementations, SoC 102 is implemented in a semiconductor package including one or more integrated circuits, and each integrated circuit integrates a subset of: one or more microprocessor or CPU cores, memory, input/ output ports and secondary storage on a single substrate. PMIC 118 is also implemented in a semiconductor package including one or more integrated circuits each of which is formed on a single substrate. SoC 102 is configured to receive one or more internal supply voltages (also called rail voltages) provided by PMIC 118 via one or more power rails. In some implementations, both SoC 102 and PMIC 118 are mounted on a main logic board, e.g., on two distinct areas of the main logic board, and electrically coupled to each other via conductive wires formed in the main logic board. This arrangement introduces parasitic effects and electrical noise that could compromise performance of the SoC, e.g., cause a voltage drop at an internal supply voltage. Alternatively, in accordance with various implementations described below, semiconductor dies of SoC 102 and PMIC 118 are vertically packaged in an integrated semiconductor device 140 (e.g., in FIG. 3), such that they are electrically coupled to each other via electrical connections that are not formed in the main logic board. Such vertical arrangement of the semiconductor dies of SoC 102 and PMIC 118 reduces a length of electrical connections between SoC 102 and PMIC 118 and avoids performance degradation caused by routing conductive wires on the main logic board.

In some implementations, a generic PMIC 118 is configured to drive different types of SoC 102 in different types of electronic devices. Regardless of whether PMIC 118 and SoC 102 are arranged side by side or vertically, PMIC 118 occupies the same footprint with respect to the main circuit board, while SoC 102 may have a distinct footprint based on the electronic modules integrated therein. PMIC 118 includes a plurality of voltage regulator units that are arranged in a field programmable array. The plurality of voltage regulator units are identical to each other, or includes more than one type of voltage regulator units. In a specific electronic device, control signals are determined based on rail voltages and rail currents of power rails required to power SOC 102 and other electronic modules, if any. For each of these power rails, a corresponding control signal is used to select a subset of voltage regulator units in the field programmable array of PMIC 118, and the selected voltage regulator units provide a rail current at a rail voltage to the respective power rail collectively. As such, PMIC 118 is reconfigured by these control signals to provide the rail voltages and currents to the power rails of SoC 102, and each voltage regulator unit in a plurality of configurable voltage regulators in PMIC 118 is either redundant or selected to drive one of the power rails by one of the control signals.

Figure 2:
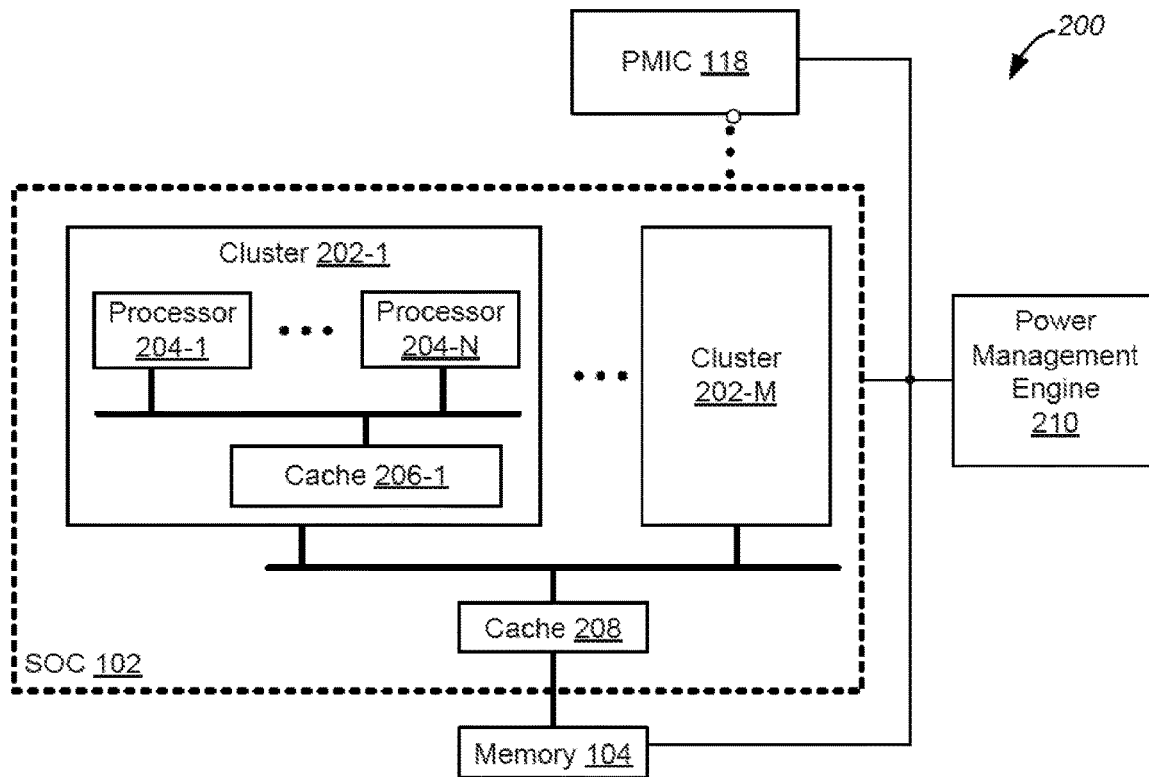
FIG. 2 is a block diagram of a power management system of the electronic device shown in FIG. 1, in accordance with some implementations.

FIG. 2 is a block diagram of an example electronic device 200 having one or more processing clusters 202 (e.g., first processing cluster 202-1, M-th processing cluster 202-M), in accordance with some implementations. Electronic device 200 further includes a cache 208 and a memory 104 in addition to processing clusters 202. Cache 208 is coupled to processing clusters 202 on SOC 102, which is further coupled to memory 104 that is external to SOC 102. Each processing cluster 202 includes one or more processors (also called processing cores) 204 and a cluster cache 206. Cluster cache 206 is coupled to one or more processors 204, and maintains one or more request queues for one or more processors 204. In some implementations, each processor 204 further includes a core cache (not shown in FIG. 2) that is optionally split into an instruction cache and a data cache, and core cache stores instructions and data that can be immediately executed by the respective processor 204. In an example, first processing cluster 202-1 includes first processor 204-1, N-th processor 204-N, and first cluster cache 206-1, where N is an integer greater than 1. In some implementations, SOC 102 only includes a single processing cluster 202-1. Alternatively, in some implementations, SOC 102 includes at least an additional processing cluster 202, e.g., M-th processing cluster 202-M. M-th processing cluster 202-M includes a first processor, . . . , an N'-th processor, and an M-th cluster cache, where N' is an integer greater than 1.

In some implementations, the one or more processing clusters 202 are configured to provide a central processing unit for an electronic device and are associated with a hierarchy of caches. For example, the hierarchy of caches includes three levels that are distinguished based on their distinct operational speeds and sizes. For the purposes of this application, a reference to "the speed" of a memory (including a cache memory) relates to the time required to write data to or read data from the memory (e.g., a faster memory has shorter write and/or read times than a slower memory), and a reference to "the size" of a memory relates to the storage capacity of the memory (e.g., a smaller memory provides less storage space than a larger memory). The core cache, cluster cache 206, and cache 208 correspond to a first level (L1) cache, a second level (L2) cache, and a third level (L3) cache, respectively. Each core cache holds instructions and data to be executed directly by a respective processor 204, and has the fastest operational speed and smallest size among the three levels of memory. For each processing cluster 202, the cluster cache 206 is slower operationally than the core cache and bigger in size, and holds data that is more likely to be accessed by processors 204 of respective processing cluster 202. The cache 208 is shared by the plurality of processing clusters 202, and bigger in size and slower in speed than each core cache and cluster cache 206.

The processing clusters 202 issue prefetch requests to extract the instructions and data to be held by each core cache from the cluster cache 206, cache 208 or memory 104. If the prefetch requests are satisfied by the cluster cache 206, the cluster cache 206 provides the instructions and data to the respective core cache for execution by the processors 204. Conversely, if the prefetch requests are not satisfied by the cluster cache 206, the prefetch requests are sent to the cache 208 to extract the instructions and data. If the prefetch requests are satisfied by the cache 208, the cache 208 provides the instructions and data to the cluster cache 206, which further passes the instructions and data to the respective core cache for execution by the processors 204. Conversely, if the prefetch requests are not satisfied by the cache 208, the prefetch requests are sent to the memory 104 external to the SoC 102 to extract the instructions and data. The memory 104 provides the instructions and data to the cache 208, which passes the instructions and data to the cluster cache 206 and then to the respective core cache.

Additionally, the processing clusters 202 issue memory access requests to write data into and read data from the cluster cache 206, cache 208 or memory 104 during normal operation of each processing cluster. Each memory access request is passed sequentially from the cluster cache 206, cache 208, and memory 104, until the respective memory access request reaches a target cache or memory. A data to be written into the target cache or memory is also passed sequentially from the cluster cache 206, cache 208, and memory 104, until the respective data reach the target cache or memory. In contrast, a data read from the target cache or memory is provided directly to the respective core caches to be used by the processors 204.

In various implementations of this application, operations of the processing clusters 202, PMIC 118, cache 208, and memory 104 consume power and create heat on the electronic device 200, and a power management engine 210 is applied to manage power consumptions of the electronic device 200 from both a firmware level and a hardware level. Specifically, the power management engine 210 is configured to receive the plurality of power samples from a plurality of power sensors distributed on an electronic device 200. The SOC 102, PMIC 118, and memory 104 are partitioned to a plurality of power domains. The power samples are processed based on locations of the corresponding power sensors to generate one or more power profiles and a plurality of power throttling thresholds for the individual power domains. Each power profile is optionally a system power profile of the entire electronic device 200 or a combination of multiple domains (e.g., a processor cluster 202, an SoC 102) or a local power profile of an individual power domain (e.g., a processor 204). Based on the one or more power profiles, the power management engine 210 implements a global power control operation having a first rate by determining power budgets among the plurality of power domains and enabling operations of the plurality of power domains according to the power budgets. Further, based on the local power profiles, the power management engine 210 enables a plurality of local power control operations having second rates on the plurality of power domains (e.g., the memory 104, PMIC 118, processing cluster 202-M) based on the plurality of power throttling thresholds. The local power control operations are more direct than the global power control, and each second rate is greater than the first rate. For example, the first rate of the global power control operation is 50 µs and a corresponding thermal response lasts for 500 µs, while the second rate of the local power control operations is 20 µs and a corresponding thermal response lasts for 100 µs. By these means, the electronic device 200 enables a hierarchical scheme to manage power consumption from both a firmware level and a hardware level.

In some implementations, the one or more power profiles include a system power profile tracking an average power consumption or an average total current of a subset or all of the plurality of power domains of the electronic system. The power management engine 210 is configured to, in accordance with the system power profile, enable the global power control operation and the plurality of local power control operations based on a requirement for a power control rate, the first rate of the global power control operation, and the second rates of the local power control operations. If the requirement for the power control rate is faster than the first rate, then the local power control operations need to be implemented directly to reduce the power consumption or total current, i.e., by a "hard throttling" process implemented directly on the hardware level. If the requirement for the power control rate is less than the first rate, a global power control operation may be taken to adjust the power budgets (e.g., P-states of the power domains) and enable local power control operations based on the power budgets, i.e., by a "soft throttling" process initiated from the firmware level. The requirement for the power control rate is determined with reference to a maximal temperature $T_{MAX}$, a maximal power consumption $P_{MAX}$, and a maximal current value $I_{MAX}$ tolerated by the electronic system. By these means, the system power profile is controlled below a predefined upper limit for the subset or all of the plurality of power domains of the electronic system.

In some implementations, the one or more power profiles include a local current profile tracking a current of a first power domain. The power management engine 210 is configured to in accordance with the local current profile, enable the global power control operation and a local power control operation focused on the first power domain based on a requirement for a power control rate, the first rate of the global power control operation, and the second rates of the local power control operations. The requirement for the power control rate is determined with reference to a maximal temperature $T_{MAX}$, a maximal power consumption $P_{MAX}$, and a maximal current value $I_{MAX}$ tolerated by the first power domain. By these means, the local current profile is controlled below a predefined current limit for the first power domain.

Figure 3:
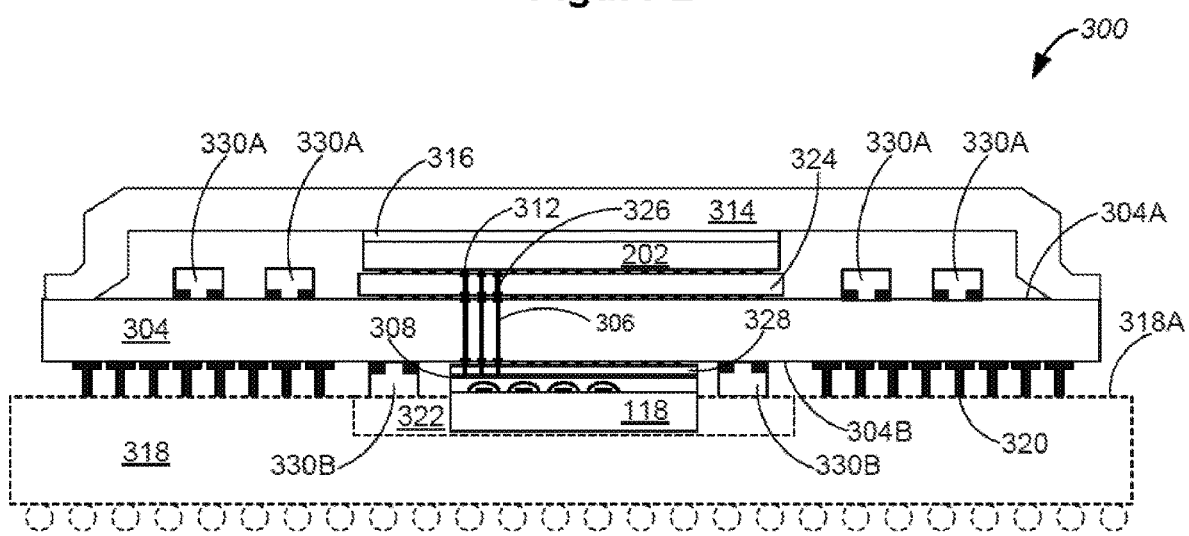
FIG. 3 is a cross sectional view of an integrated semiconductor device having an SoC and a PMIC chip, in accordance with some implementations.

FIG. 3 is a cross sectional view of an integrated semiconductor device 300, in accordance with some implementations. Semiconductor device 300 integrates at least one SoC die 202 and at least one PMIC die 118 in a semiconductor package, and includes at least a package substrate 304 having a first surface 304A and a second surface 304B that is opposite to first surface 304A. SoC die 202 is disposed on first surface 304A of package substrate 304, and PMIC die 118 is coupled to second surface 304B of package substrate 304. In some implementations, a first interposer 324 is disposed between SoC die 302 and first surface 304A of package substrate 304. In some implementations, a second interposer 328 is disposed between PMIC die 118 and second surface 304B of package substrate 304. In some implementations, the integrated semiconductor device 300 is disposed on a printed circuit board (PCB) with memory 104 and a power management engine 210. The power management engine 210 is configured to manage power consumption of an entire electronic system formed on the PCB on both a firmware level (i.e., a board level) and a hardware level (i.e., on an individual hardware level, such as on an SoC level and on a memory level). In some implementations, the integrated semiconductor device 300 includes one or more power domains, and the power management engine 210 is configured to manage power consumption of each individual power domain on the hardware level.

Package substrate 304 further includes a plurality of first via interconnects 306 that pass through a body of package substrate 304 and is exposed on both first and second surfaces 304A and 304B, respectively. PMIC die 118 is electrically coupled to SoC die 202 via the plurality of first via interconnects 306 of package substrate 304. Specifically, PMIC die 118 includes a plurality of DC connections 308 configured to output a plurality of rail voltages, provided to power rails. When PMIC die 118 is mounted on second surface 304B of package substrate 304, DC connections 308 are electrically coupled to the plurality of first via interconnects 306 of package substrate 304. In some implementations, SoC die 202 includes a plurality of power connections 312 configured to receive the plurality of rail voltages. When SoC die 202 is mounted on first surface 304A of package substrate 304, power connections 312 are electrically coupled to the plurality of first via interconnects 306 of package substrate 304. As such, PMIC die 118 is configured to provide DC power (i.e., rail voltages and rail current of power rails) to SoC die 202 via DC connections 308 of PMIC die 118, power connections 312 of SoC die 202, and first via interconnects 306 of package substrate 304. Further, by using very low impedance DC connections 308, the quality of the DC power provided PMIC die 118 to SoC die 202 is substantially improved relative to systems in which PMIC die 118 and SoC die 202 are separately packaged and positioned side by side on a main circuit board.

In some implementations, a power management interface on PMIC die 118 is controlled by a master power management interface of SoC die 202, and configured to receive digital power control signals from SoC die 202. A subset of first via interconnects 306 is configured to transfer digital power control signals from SoC die 202 to PMIC die 118.

SoC die 202 has a first footprint on package substrate 304, and PMIC 118 has a second footprint on package substrate 304. The first and second footprints at least partially overlap for the purposes of coupling DC connections 308 of PMIC die 118 and power connections 312 of SoC die 202 directly using the plurality of first via interconnects 306. In some situations, the first footprint of SoC die 202 is larger than and entirely encloses the second footprint of PMIC die 118. Alternatively, in some situations, the first footprint of SoC die 202 is offset from the second footprint of PMIC die 118, but at least partially overlaps the second footprint of PMIC die 118. DC connections 308 of PMIC die 118, power connections 312 of SoC die 202, and first via interconnects 306 of package substrate 304 are aligned and enclosed in an overlapped area of the first and second footprints.

In some implementations, integrated semiconductor device 300 further includes a cover 314 coupled to first surface 304A of package substrate 304. Cover 314 is configured to conceal SoC die 202 and at least part of first surface 304A of package substrate 304, thereby protecting SoC die 202 and at least part of first surface 304A. Further, in some implementations, cover 314 is made of an electrically conductive material and configured to be grounded to provide electrostatic shielding for SoC die 202 and any other circuit on first surface 304A, if completely concealed by cover 314, or the part of first surface 304A concealed by cover 314, if first surface 304A is only partially concealed by cover 314. In some situations, cover 314 is made of a thermally conductive material configured to dissipate heat generated by SoC die 202.

In some implementations, semiconductor device 300 further includes a socket substrate 318. Socket substrate 318 has a third surface 318A facing second surface 304B of package substrate 304. Package substrate 304 is electrically coupled to socket substrate 318 via a plurality of electrical connectors 320. Specifically, second surface 304B of package substrate 304 includes a first area (e.g., a central area) to which PMIC die 118 is mechanically coupled and a second area (e.g., a peripheral area) where the plurality of electrical connectors 320 are located. In an example, the second area is adjacent to and surrounds the first area. It is noted that under some circumstances, semiconductor device 300 is provided with socket substrate 318. However, under some circumstances, socket substrate 318 is fixed on a circuit board of the electronic device in FIG. 1, and is not part of integrated semiconductor device 300. Rather, semiconductor device 300 is a replaceable part that is provided to offer functions of a combination of PMIC die 118 and SoC die 202.

In some implementations, third surface 318A of socket substrate 318 is substantially flat, and PMIC die 118 is disposed between second surface 304B of package substrate 304 and third surface 318A of socket substrate 318. Alternatively, in some implementations, socket substrate 318 includes a recessed portion 322 that is formed on third surface 318A and configured to receive PMIC die 118 when PMIC die 118 is mechanically and electrically coupled to second surface 304B of package substrate 304. In some situations, PMIC die 118 is suspended in recessed portion 322, i.e., separated from a bottom surface of recessed portion 322 by an air gap. Alternatively, in some situations, PMIC die 118 comes into contact with the bottom surface of recessed portion 322 directly or via an intermediate layer (e.g., an adhesive layer, a thermal spreader layer, or a layer that is both adhesive and a thermal spreader).

In some implementations, semiconductor device 300 further includes one or more discrete electronic modules 330 (e.g., resistor, capacitor, inductor, transistors, and logic chip). Discrete electronic modules 330 may be electrically coupled in an input/output interface circuit of SoC die 202 to control input/output coupling for SoC die 202. Optionally, a subset of discrete electronic modules 330 (e.g., components 330A) is disposed on first surface 304A of package substrate 304. Each component 330A may be contained within cover 314 or located outside cover 314. Optionally, a subset of discrete electronic modules 330 (e.g., components 330B) is mechanically coupled to second surface 304B of package substrate 304. If a respective component 330B has a low profile (e.g., thinner than a length of electrical connectors 320), component 330B may fit into a gap between second surface 304B of package substrate 304 and third surface 318A of socket substrate 318. Otherwise, if component 330B does not have a low profile (e.g., thicker than the length of electrical connectors 320), a respective component 330B can be received by recessed portion 322 of socket substrate 318 and disposed adjacent to PMIC die 118.

SoC die 202 and PMIC die 118 are vertically arranged in semiconductor device 300. Power connections 312 of SoC die 202 and DC connections 308 of PMIC die 118 are aligned and positioned in proximity to each other, thereby reducing parasitic resistance and capacitance coupled to each power rail that provides a rail voltage to SoC die 202. It is noted that in some implementations, a plurality of PMIC dies 118 can be disposed in recessed portion 322 of socket substrate 318 and electrically coupled to one or more SoC dies 202 disposed on first surface 304A of package substrate 304. For example, two PMIC die 118 are disposed in recessed portion 322 of socket substrate 318 to power four SoC dies 202 collectively. One of SoC dies 202 optionally corresponds to a microprocessor or CPU core or a cluster of microprocessor or CPU cores.

Additionally, in some implementations of this application, PMIC die 118 includes a field programmable array of voltage regulators that is configurable by control signals to drive different types of SoC dies 202. In some situations, the same PMIC die 118, package substrate 304, and socket substrate 318 are used to support the different types of SoC dies 202. Recessed portion 322 formed on socket substrate 318 has a fixed size to accommodate the same PMIC die 118, and first via interconnects 306 that pass through the body of package substrate 304 have fixed locations. Alternatively, in some situations, while footprint sizes of package substrate 304 and socket substrate 318 are varied for the different types of SoC dies, the same PMIC die 118 allows recessed portion 322 and first via interconnects 306 of package substrate 304 to remain unchanged, thereby avoiding custom designing PMIC die 118 and the entire package for each individual type of SoC die 202. As such, application of the field programmable array of voltage regulators in PMIC die 118 simplifies an assembly process and enhances cost efficiency of the semiconductor device 300.

Figure 4:
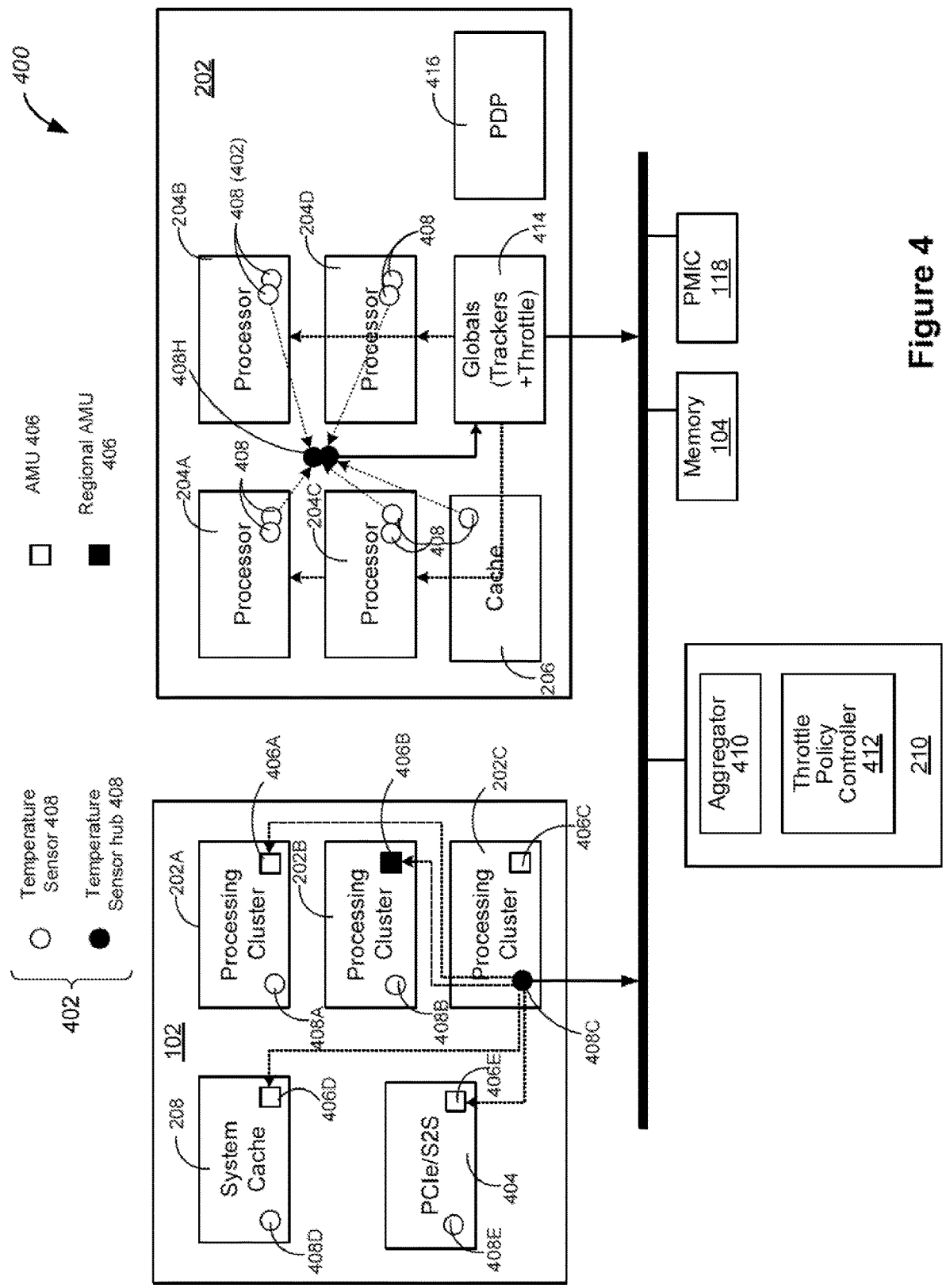
FIG. 4 is a block diagram of a processor system of an electronic device including a plurality of distributed power sensors and a power management engine, in accordance with some implementations.

FIG. 4 is a block diagram of a processor system 400 of an electronic device including a plurality of distributed power sensors 402 and a power management engine 210, in accordance with some implementations. The processor system 400 includes at least an SoC 102 and a power management engine 210. The SoC 102 has at least one or more processing clusters 202, system cache 208, and one or more Peripheral Component Interconnects (PCIs) and socket-to-socket controller 404. The SoC 102 is powered by one or more power rails that are powered by the PMIC 118. Power consumptions of the SoC 102 can be directly monitored by the power sensors 402 and reported to the power management engine 210.

The SoC 102 is optionally coupled to one or more additional components that include, but are not limited to, memory 104 external to the processing clusters 202, PMIC 118 that is optionally integrated with the SoC 102, a system control, manageability and debug (CMD) component, a security processor, and an input/output (IO) controller 106. In some implementations, these components of the processor system 400 are mounted on a circuit board. These components in the processor system 400 are also powered by a plurality of power rails provided by the PMIC 118. Specifically, the PMIC 118 receives one or more input supply voltage and generates a plurality of power supply voltages to drive the plurality of power rails of the SoC 102, memory 104, PMIC 118, PCIs 404, and any other components in the processor system 400. As such, the power management engine 210 may monitor power consumptions of the components of the processor system 400 directly from the power rails driven by the PMIC 118.

The plurality of power sensors 402 are distributed on a subset of the processor system 400, i.e., on one or more of the SoC 102, memory 104, PMIC 118, PCIs 404, system CMD component, security processor, IO controller 106, and the like. In some implementations, the power sensors 402 include a set of activity monitor units 406 (AMUs, also called telemetry sources) and a set of temperature sensors 408. The AMUs 406 are configured to measure power consumptions, current values, or both associated with different power rails. In some embodiments, the AMUs 406 are configured to measure activity levels of the corresponding subset of the processor system 400, and the activity levels are used to estimate the power consumptions and/or current values of the corresponding subset of the processor system 400. The temperature sensors 408 are configured to measure temperature values locally at the domains wherein the temperature sensors are disposed. For example, in FIG. 4, the SoC 102 includes three processing clusters 202A, 202B, and 202C, a system cache 208, and a PCI or socket-to-socket controller 404. Each of the processing clusters 202, system cache 208, and PCI or socket-to-socket controller 404 is coupled to one or more AMUs 406 configured to measure the power consumptions and/or current values of one or more power rails of the respective component and one or more temperature sensors 408 configured to measure the temperature values of the respective component.

In some implementations, a subset of AMUs 406 are adjacent to each other. One of the subset of AMUs 406 is a regional AMU (R-AMU) 406, while other AMUs 406 in the subset are local AMUs 406. The regional AMU 406 collects power samples from the local AMUs 406, and optionally preprocess the collected power samples. For example, in the SoC 102, the AMU 406B coupled to a power rail of the second processing cluster 202B acts as a regional AMU of the subset of AMUs 406A-406E that are distributed on the SoC 102. The power samples collected from the subset of AMUs 406A-406E are optionally consolidated by the regional AMU 406B and sent to the power management engine 210. In some implementations, a subset of temperature sensors 408 are adjacent to each other and subject to control of one of temperature sensors 408, and the one of the subset of temperature sensors 408 is a temperature sensor hub 408. For example, in the SoC 102, the temperature sensor 408C coupled to the third processing cluster 202C acts as a temperature sensor hub of the subset of temperature sensors 408A-408E that are distributed on the SoC 102. The temperature samples collected from the subset of temperature sensors 408A-408E are optionally consolidated by the temperature sensor hub 408C and sent to the power management engine 210. In some situations, the temperature sensor hub 408C also collects and/or consolidates power samples from the AMUs 406 around the hub 408C, and the regional AMU 406B also collects and/or consolidates samples from the temperature sensors 408 around the regional AMU 406B.

In some implementations, each processing cluster 202 includes a plurality of processors 204A-204D (also called processor cores 204) and cluster cache 206. A number of temperature sensors 408 are distributed on the processors 204 and cluster cache 206. For example, each processor 204 has two temperature sensors 408, and each cluster cache 206 has a single temperature sensor 408. A temperature sensor hub 408H includes two controllers and is configured to consolidate the temperature samples collected by the temperature sensors 408 of the entire processing cluster 202.

In some implementations, power samples (e.g., power consumption, current values, and temperature values) measured by the AMUs 406 or temperature sensors 408 are applied locally on the hardware level to control power consumption or current level of a corresponding processor 204 or a processing cluster 202. For example, the power samples are compared directly with a current throttling threshold $I_{TRT}$ to disable operation of a processor 204 or vary a power performance state (P-state) of the processor 204 (e.g., switch among a set of different predefined P-states). The power samples may be averaged over a time window or across two or more distinct AMUs to obtain an averaged power sample. The averaged power sample is compared with the current throttle threshold $I_{TRT}$ to disable operation of the processor 204 or vary the P-state of the processor 204. Such a local hardware-level power control operation is implemented on individual processors 204, processor clusters 202, and SoC 102, except that the current throttle threshold $I_{TRT}$ may be predetermined by the power management engine.

The components coupled to the power management engine 210 are partitioned into a plurality of power domains. For example, an SoC 102, a single processing cluster 202, or a processor 204 is one of the domains. Each power domain has a respective set of power sensors 402 including one or more AMUs 406 and one or more temperature sensors 408. In some implementations, both the one or more AMUs 406 and one or more temperature sensors 408 are physically located at the respective power domain. In some implementations, the one or more temperature sensors 408 are physically located at the respective power domain, while the one or more AMUs 406 are located at a portion of the PMIC 118 configured to provide the power rails to the respective power domain, and electrically coupled to the power rails on the PMIC 118. In some implementations, the power samples collected from each power domain are pooled and sent to the power management engine 210 by a regional AMU 406 or a temperature sensor hub 408 according to a global pooling frequency.

The power management engine 210 includes an aggregator 410 and a throttle policy controller 412. The aggregator 410 is configured to collect the power samples collected by the distributed power sensors 402 or power samples consolidated from the collected power samples. In some implementations, the aggregator 410 generates a system power profile indicating overall power performance of the entire processor system 400 or a combination of multiple power domains. An example of the system power profile is a system temperature profile (e.g., curve 602 in FIG. 6) indicating a temporal variation of an average temperature of an entire SoC 102. In some implementations, the aggregator 410 generates one or more local power profiles each indicating local power performance of an individual domain. For example, a local temperature profile of a processor 204 (e.g., curve 606 in FIG. 6) indicates a temporal variation of an average temperature determined from all of the temperature sensors 408 of the processor 204A in FIG. 4. In some implementations, the aggregator 410 defines and/or adjusts a plurality of power throttling thresholds for the plurality of domains. The throttle policy controller 412 is configured to provide each of the power throttling thresholds to a respective domain or a respective subset of domains to control power consumption of the respective domain or subset of domains.

In some implementations, each processor cluster 202 includes a global module 414 coupled to the one or more processors 204, cluster cache 206, and the plurality of power sensors 402. The global module 414 is configured to collect the power samples measured by the power sensors 402 and/or the power samples consolidated by the temperature sensor hub 408H or regional AMU 406 and send the collected power samples to the aggregator 410 of the power management engine 210. The global module 414 is also configured to receive the plurality of power throttling thresholds and control signals from the throttle policy controller 412 of the power management engine 210 and enable local power control operations including architecture throttling, clock throttling, performance point throttling, and activation of different predefined P-states. It is noted that, in some embodiments, throttling actions in each domain are controlled by the PDP 416 during a global power control operation and by the global module 414 during a local power control operation.

For clarification, in some embodiments, the global power control operations are implemented by the entire SoC 102 or by a processor cluster 202, and involve the power management engine 210. The local power control operations are implemented locally in each processor cluster 202 or each processor 102 of the processing cluster 202, without involving the power management engine 210. Alternatively, a regional power control operation refers to power control operations associated with a subset (not all) of adjacent power domains (e.g., each processor cluster 202 in FIG. 4), and the local power control operations are limited to each individual domain (e.g., processor 102).

Figure 5A:
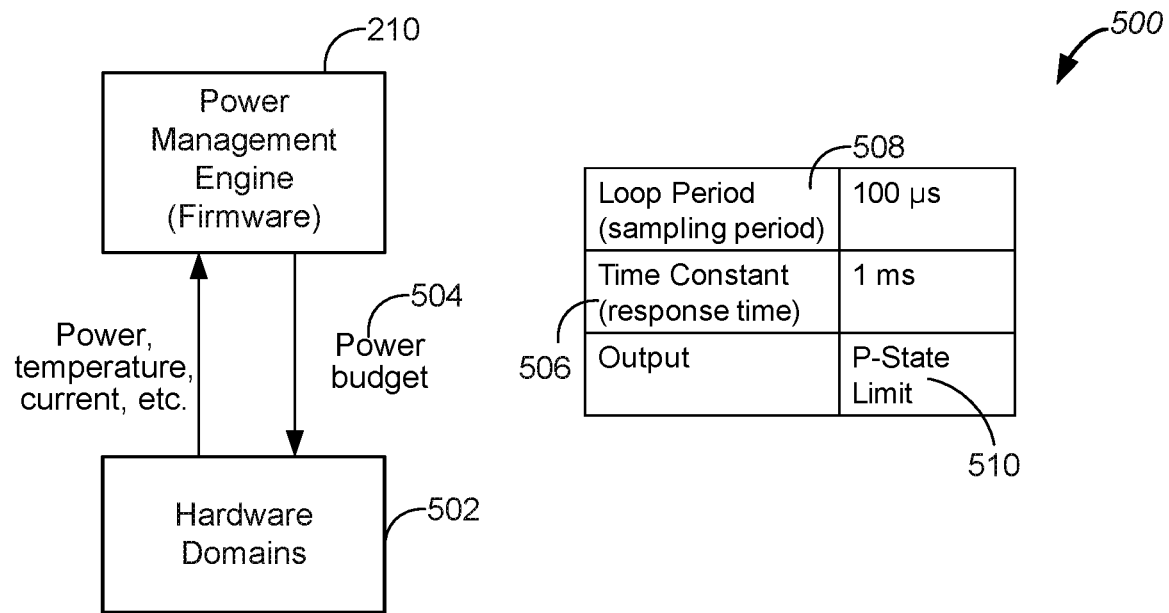
FIGS. 5A and 5B are block diagrams of power management system configured to manage power of an SoC-based electronic device on a firmware level and a hardware level, in accordance with some implementations, respectively.
Figure 5B:
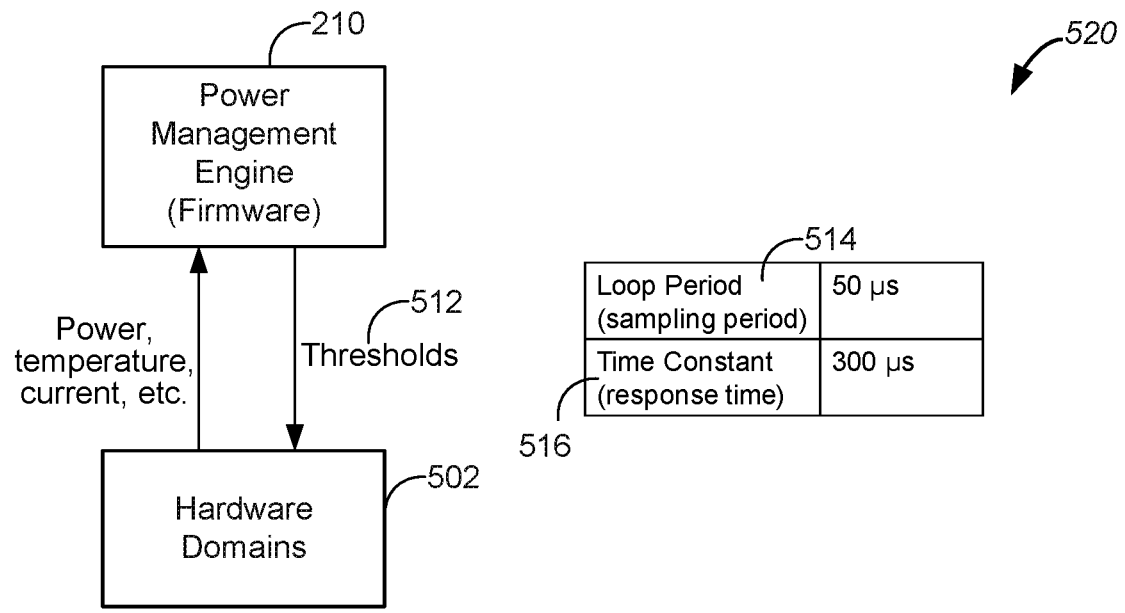
Figure 5C:
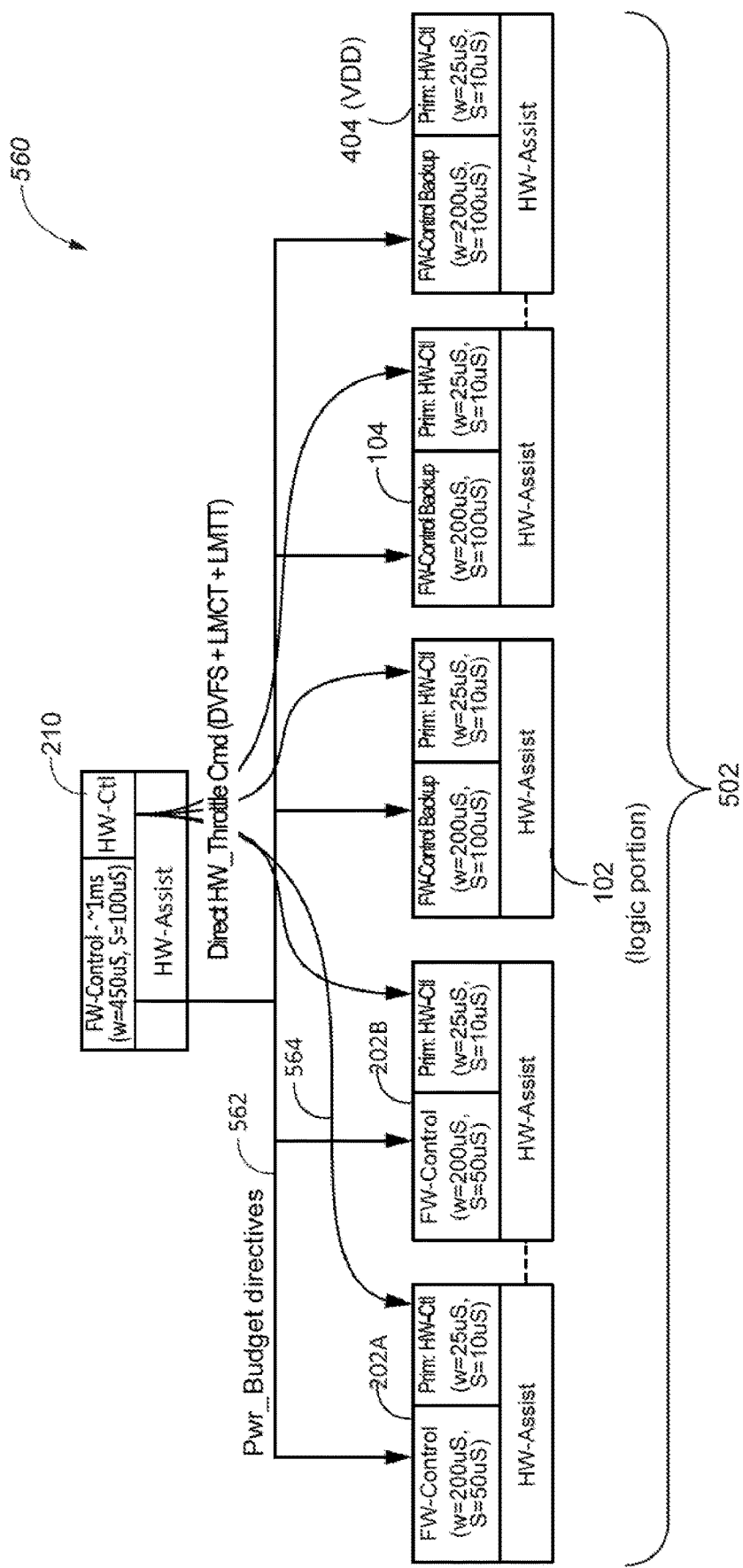
FIG. 5C illustrates a comprehensive power management scheme in which power of an SoC-based electronic device is managed on both a firmware level and a hardware level, in accordance with some implementations.

FIGS. 5A and 5B are block diagrams of power management systems 500 and 520 configured to manage power of an SoC-based electronic device on a firmware level and a hardware level, in accordance with some implementations, respectively. FIG. 5C illustrates a comprehensive power management scheme 560 in which power of an SoC-based electronic device 200 is managed on both a firmware level and a hardware level, in accordance with some implementations. As explained above with reference to FIG. 2, the power management engine 210 is configured to enable both firmware-level and hardware-level power management tasks. Specifically, the power management engine 210 collects a plurality of power samples from a plurality of power domains 502 and generates one or more power profiles and a plurality of power throttling thresholds for the individual power domains 502, and each power profile is optionally a system power profile of the entire electronic device 200 or a combination of multiple domains (e.g., a processor cluster 202, an SoC 102) or a local power profile of an individual power domain (e.g., a processor 204). The plurality of power samples is measured by a plurality of power sensors 402 distributed across the domains or preprocessed from raw power samples measured by the power sensors 402.

On the firmware level, the power management engine 210 implements a global power control operation having a first rate based on the one or more power profiles, e.g., by distributing (562) power budgets 504 among the plurality of power domains 502 and enabling operations of the plurality of power domains 502 according to the power budgets. Temporal lengths 506 of power management physical control loops (i.e., long control loops) range from tens of nanoseconds to several milliseconds. Typical temporal lengths 506 are in a range of 100 μs to 1 ms. In some implementations, the global power control operation is implemented jointly by the power management engine 210 and each domain's Power and Debug Processor (PDP) 416.

The global power control operation is implemented periodically according to a first loop period 508, e.g., every 100 μs or faster for an event associated with the PDP 416. In some implementations, the global power control operation includes selecting one of a plurality of predefined power performance states (P-states) 510 for each of a plurality of processors. Each of the P-states corresponds to predefined set of power and performance settings of the processors. The power budgets are distributed among the plurality of domains according to the predefined power and performance settings of the selected P-state 510 of each processor. In some implementations, the global power control operation includes determining what throttling operations to take on individual domains. The power management engine 210 provides the plurality of power throttling thresholds 512 to different power domains 502 and enables the domains to implement such throttling operations.

It is noted that in some implementations, the global power control operation is implemented in response to a local event occurring to a local power profile of a specific domain. The event may not be so critical that the response time associated with the global power control operation is sufficient to address the event. For example, an event occurring to a local power profile of a processor cluster 202 is associated with a PDP 416 of the processor cluster 202, and can be resolved by the global power control operation that is implemented with a loop period corresponding to 100 μs.

On the hardware level, the individual domains 502 preload (564) the plurality of power throttling thresholds 512 set by the power management engine 210, and implement the local power control operations (e.g., the throttling actions) without involving extended firmware-level operations in real time. Referring to FIG. 5C, the different power domains 502 monitored and controlled include two processing clusters 202A and 202B, a logic portion of the SoC 102, memory 104, and a socket-to-socket connector 404 (more specifically, a power rail VDD of the connector 404). The power management engine 210 or an individual power domain 502 monitors a local power profile and enables one or more local power control operations having second rates on the individual power domain 502 (e.g., the memory 104, PMIC 118, processing cluster 202-M) based on an associated power throttling threshold 512. For example, a current of the processing cluster 202 is monitored to exceed a predefined high peak current $I_{MAXH}$ (e.g., 1 A) for a duration longer than a predefined short burst time $t_{BS}$ (e.g., 20 μs). A current control signal is generated for the individual power domain 502 or the PMIC 118 to request reduction of the current of the processing cluster 202. The power throttling thresholds 512 (e.g., $I_{MAXH}$) are predetermined for the local power control operations and can be applied to the individual domains 502 directly. No firmware-level power budget redistribution is needed in real time. In an example, a local power control operation is implemented periodically according to a second loop period 514, e.g., every 50 μs, and temporal lengths 516 of corresponding power management control loops are approximately 300 μs. As such, individual domains' local power control operations respond more promptly on the hardware level than the global power control operation implemented on the firmware level.

In some implementations, for each domain 502, a local power control operation includes a throttling action selected from architecture throttling, power rail scaling, and clock throttling. Architecture throttling is applied to periodically block traffic to the respective domain including DRAM or suppress high current spikes in the respective domain including a processor. Clock throttling is applied to reduce a clock frequency of the respective domain. Performance point throttling is applied to adjust the clock frequency and power supply voltages of the respective domain jointly. In some situations, voltage regulators coupled to respective power rails of the respective domain are adjusted to vary power supply voltages and associated current injected into the respective power rails.

Referring to FIG. 5C, in some implementations, the global power control operation and local power control operations are applied jointly and correspond to different priorities in different situations. Global power control operation typically requires total budget calculation, subdomain budget partition, or budget reallocation. In some situations, when operations of the plurality of power domains 502 are enabled according to the power budgets, domain specific control loops are optionally applied with higher level algorithms having long control loops and complex computation. The power management engine 210 is involved to control the domain specific control loops on the firmware level. This also explains why the first rate of the global power control operation is less than the second rates of the local power control operations. Alternatively, in some situations, when operations of the plurality of power domains 502 are enabled according to the power budgets, the power throttling thresholds 512 applied in the local power control operations are applied or predefined P-states 510 are loaded according to predefined operation condition policies, which can effectively enhance the first rate of the global power control operation.

In some implementations, a plurality of power samples are collected from a plurality of domains 502 according to a local sampling rate (e.g., 1 sample every 1 μs). Each local power profile includes a temporal sequence of local power samples, and each local power sample is combined from a respective subset of collected power samples of a respective domain according to a pooling rate. For example, each local power sample is an average of the respective subset of current samples measured for a current of a power rail of a processing processor 204, and averaged over a time window having a predefined temporal length (e.g., 10 μs). Such data collection and averaging are implemented on the hardware level, i.e., by individual domains 502, before or after the local power samples of each local power profile are reported to the power management engine 210. Thus, in some implementations, the power management engine 210 has a period of a predefined controlling frequency that does not exceed the predefined temporal length. Local power control operations that are based on comparisons with power throttling thresholds have local controlling frequencies, and the local controlling frequencies do not exceed the predefined temporal length of the time window. The power management engine 210 is not directly involved in continuous periodic loops of local power value evaluation and power control on individual power domains, except that the power throttling thresholds 512 used in the local power control operation are predetermined by the power management engine 210 on the firmware level.

In some situations, a loop control time constant of the firmware's long control loop or the hardware's short control loop is dynamically adjusted. For example, when an SoC 102 temperature has risen close to a maximal temperature $T_{MAX}$, the loop control time constant is reduced to enable close monitoring. If the loop control time constant is too short for the global power control operation, primary control is passed to the local power control operations by individual domains. More details on an example temperature control process are described below with reference to FIG. 6. In some situations, the power management engine 210 reduces the power throttling thresholds 512 of individual domains 502 to capture excursions first. In some situations, power control windows are shorted to allow less generous opportunistic performance boosts in place of more stringent limits enforcement. In some situations, the power management engine 210 uses throttle levels and event monitoring to detect excessive throttling activation by individual domains 502 and modify power throttling thresholds under its purview to attain a more efficient operations.

Firmware-level power management control (FIG. 5A) by the power management engine 210 corresponds to a long control loop. Hardware-level power management control (FIG. 5B) by the individual domains corresponds to a short control loop. In the long control loop, hardware-level throttling mechanisms (e.g., implemented by the local power control operations) act as backup and fallback for the firmware-level power management control, thereby ensuring the plurality of domains 502 to comply with respective power limits, particularly, when the power management engine 210 has skipped a beat or when the long control loop has not properly identified an error size. In the short control loop, the hardware-level throttling mechanisms (e.g., implemented by the local power control operations) act as primary control agents and provide short time-duration loop enforcement and fast responses. For example, a multi-level throttling mechanism is applied to implement a level of hysteresis and complements the firmware-level power management control.

In some situations, power management is tasked with maximizing the electronic device's performance on an incoming instruction stream, based on a given set of operating system (OS) performance directives, under a given set of external constraints. The incoming instruction stream varies greatly per domain, among processing cores 204, and even during execution from one program phase to another. The performance directives satisfy the OS performance level requirements and expectation. In some cases, the performance directives also satisfy performance and power preferences for each processing core 204 and/or cluster 202. Constraints may vary (e.g., correspond to different time windows) among different devices and domains (e.g., SoC, memory 104). Particularly, in an example, a processing core constraint has a time window that is too short to implement on a firmware level via the power management engine 210, and the time window can only be accomplished by applying the processing core constraint directly on a corresponding processing core. As such, power management of an SoC-based electronic device requires a combination of hardware and firmware policies, tracking physical constraints, OS requirements and directives, and instruction stream characteristics to optimize performance and power tradeoffs.

In some implementations, an operating system uses a collaborative processor performance control (CPPC) infrastructure for requesting SoC performance changes. For example, the operating system and processors 204 of the SoC 102 can optimize power consumption through different p-states (power performance states), and the processors 204 are operated at different frequencies. A high-performance mode of a processor 204 reflects an absolute maximum performance the processor 204 may reach, assuming ideal conditions. This performance level does not sustain for long durations and may only be achievable by forcing other processors 204 or memory 104 into a specific state (e.g., an idle state). A nominal performance of a processor 204 reflects a maximum sustained performance level of the processor 204, assuming ideal operating conditions. In the absence of an external constraint (power, thermal, etc.), this is the performance level that the SoC-based electronic device maintains continuously. In some implementations, all processors 204 sustain their nominal performance mode simultaneously. A guaranteed performance mode of a processor 204 reflects a current maximum sustained performance level of the processor 204, taking into account all known external constraints (power budgeting, thermal constraints, DC or AC power source, etc.). In some implementations, all processors sustain their guaranteed performance levels simultaneously. The guaranteed performance level is required to fall in a performance range between a lowest performance level and a nominal performance level that corresponds to the nominal performance mode, inclusive. In some situations, the guaranteed performance mode is updated once per second to reflect thermal and power constraints.

A processor system is configured to monitor the throttling actions controlled by the power management engine 210 over time and collaborate with the power management engine 210 in real time to maximize performance of the entire processor system while keeping temperature/power usage of its power domains within predefined operating ranges. In some implementations, if the processor system determines that the power management engine 210 is taking excessive throttling actions (e.g., in excess of a predefined percentage over a time duration), the processor system may reassign processes to different clusters 202 and/or processors 204 or bring on-line additional clusters 202 and/or SOCs 102 to reduce globally excessive workloads. For example, in some implementations, such a situation is determined to exist if a substantial percentage of the processing clusters 202 have one or more domains with a measured temperate that is consistently above a predefined threshold temperature $T_{SET}$.

Figure 6:
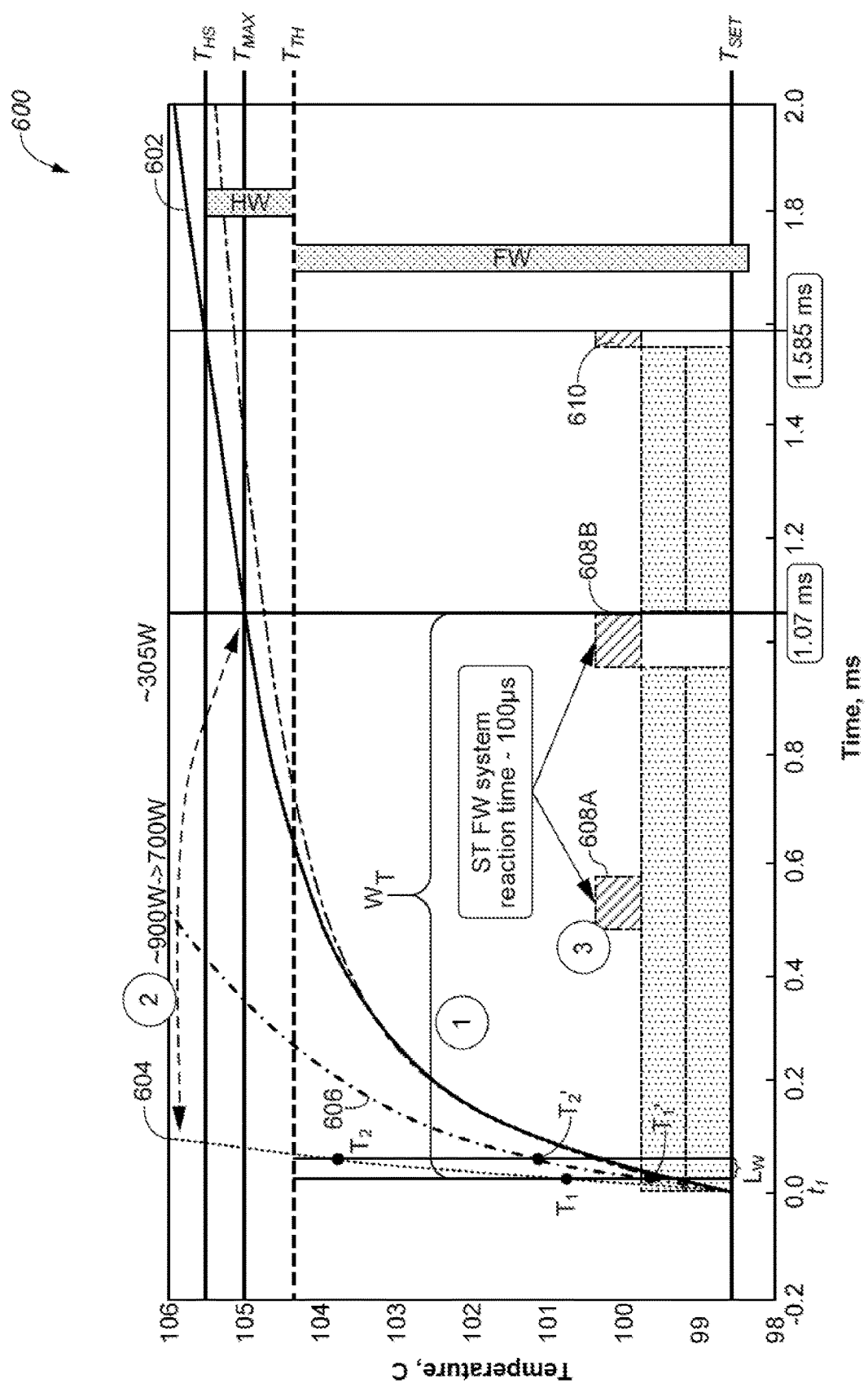
FIG. 6 is a temporal diagram of device temperatures of an electronic device including an SoC, in accordance with some implementations.

FIG. 6 is a temporal diagram of device temperatures 600 of an electronic device including an SoC 102, in accordance with some implementations. The electronic device is configured to monitor system temperature profiles 602 and 604 of an SoC 102 and a local temperature profile 606 of a processor 204. Global and local power control operations are applied to adjust power consumptions and thermal responses of the SoC 102 or processor 204 under different conditions. When the SoC 102 operates at a predefined operation frequency (e.g., 3.6 GHz), the temperature of the SoC 102 is configured to stabilize at a first threshold temperature $T_{SET}$ (e.g., 98-99° C.). In some implementations, temperature-based power control is applied to achieve stable performance close to the predefined operation frequency.

In some situations (e.g., associated with the profile 602), the processors 204 of the SoC 102 are allowed to exceed power limits for short durations of time. The PMIC 118 can enhance a nominal current (e.g., $I_{CC,nom}$) for a predefined time window (e.g., $1.35 I_{CC,nom}$ for 300-400 μs, $1.2 I_{CC,nom}$ for 1 ms). A maximal current tolerance $I_{CC,MAX}$ is disabled from limiting this enhanced current within the predefined time window. The temperature of the SoC 102 slowly increases towards a maximal temperature Tuff until a local power control operation 610 is applied to reduce a temperature increase rate. In some situations (e.g., associated with the profile 604), bursts of instruction sequences occur and cause a sudden increase of power consumption and a sudden temperature increase. Such bursts of instruction sequences normally settle and return to normal processing levels within a duration of time, e.g., 300-1000 μs. The temperature or power increase is monitored over a predefined window size $L_W$ corresponding to the duration of time. If the temperature or power increase exceeds a predefined limit, the increase is determined as excessive, and throttling actions are taken to suppress the temperature or power increase.

Specifically, a processor system (e.g., an SoC 102) includes one or more processing clusters 202 each of which includes one or more processors 204. The processors 204 of the SoC 102 are associated with a plurality of domains 502. A plurality of power samples are measured for the plurality of domains 502. In some embodiments, the plurality of power samples are averaged according to a global pooling rate at a local temperature sensor hub 408 or regional AMU 406. The measured or averaged power samples are sent to a power management engine 210. The power management engine 210 further processes the power samples associated with the plurality of domains to generate a system temperature profile 602. The system temperature profile 602 tracks a temperature level of the SoC 102, and therefore, includes a temporally-ordered sequence of system temperature values.

During normal operation of the SoC 102, the power management engine 210 determines whether the system temperature profile 602 increases to and beyond the first temperature threshold $T_{SET}$. If the system temperature profile 602 increases to and beyond the first temperature threshold $T_{SET}$ at a first time $t_1$, the temperature values of the system temperature profile 602 are compared with a second temperature threshold $T_{TH}$ or a maximal temperature $T_{MAX}$ at a predefined controlling frequency (e.g., every 480 μs). If the respective system temperature value is between the first temperature threshold $T_{SET}$ and second temperature threshold $T_{TH}$, a global power control operation is enabled to determine power budgets of the plurality of domains on a firmware level and enable operations of the plurality of domains according to the power budgets. If the respective system temperature value is greater than the second temperature threshold $T_{TH}$ or if the respective system temperature value is greater than the first temperature threshold $T_{SET}$ for longer than a threshold duration of time (e.g., 1 ms), a subset of domains are selected, and a respective power throttling action is applied to each of the subset of domains on a hardware level. By these means, when the respective system temperature value is greater than the second temperature threshold $T_{TH}$ or if the respective system temperature value is greater than the first temperature threshold $T_{SET}$ for longer than a threshold duration of time (e.g., 1 ms), a short power control loop is applied on the hardware level to control the temperature value of the SoC 102 below the maximal temperature $T_{MAX}$.

For the system temperature profile 602, two global power control operations 608A and 608B are applied on the firmware level within the threshold duration of time $W_T$ (e.g., 1 μs). The threshold duration of time $W_T$ is the longest duration of time allowed at a corresponding enhanced current of the SoC 102. After the threshold duration of time $W_T$, local power control operations 610 follow the two global power control operations 608A and 608B to control the temperature value of the SoC 102 at a faster rate. The global power control operations 608A and 608B have an example reaction time of 100 μs, and the local power control operations 610 have an example reaction time of 20 μs. In some embodiments, the temperature value of the system temperature profile 602 increases beyond a hard shutdown temperature $T_{HS}$, and a hard shutdown operation is applied to different power domains of the SoC 102 to cool down the SoC 102.

Upon a burst of instructions in the SoC 102, the system temperature profile 602 changes to an alternative system temperature profile 604 that has a greater temperature increase rate. In an example, the system temperature profiles 602 and 604 correspond to overall power consumptions of 700 W and 900 W by the SoC 102, respectively. A predefined temperature increase limit ΔT in the predefined window size $L_W$ corresponds to an upper limit for a tolerable burst of instructions. In some implementations, the predefined temperature increase limit ΔT is programmable. Beyond the predefined temperature increase limit ΔT, prompt local power control operations (e.g., throttling actions) need to be applied. Specifically, in some implementations, a first temperature value $T_1$ and a second temperature value $T_2$ correspond to a start and an end of a time window having the predefined window size $L_W$ on the system temperature profile 604, respectively. The first temperature value $T_1$ is optionally equal to the first threshold temperature $T_{SET}$, while the second temperature value $T_2$ is less than the second threshold temperature $T_{TH}$. A temperature difference between the first and second temperature values $T_1$ and $T_2$ is determined and compared with the predefined temperature increase limit ΔT, indicating whether a power surge occurs. If the temperature difference exceeds the predefined temperature increase limit ΔT, a subset of domains of the SoC 102 are selected, and a respective local power control operation (e.g., a power throttling action) is applied to each of the subset of domains on the hardware level. Examples of the respective power throttling action include architecture throttling, clock throttling, and performance point throttling. By these means, when the burst of instructions occurs in the SoC 102, the temperature value of the SoC 102 cannot exceed the maximal temperature $T_{MAX}$, and the local power control operation is applied to bring down the power consumption, e.g., from 900 W to 700 W.

During both normal operation and the burst of sequences of the SoC 102, the local power control operations correspond to a short power control loop intended to address power bursts. The short power control loop ensures that the temperature value of the SoC 102 does not increase beyond the maximal temperature $T_{MAX}$ in the threshold duration of time $W_T$ following the first time $t_1$ when the SoC 102 reaches the first threshold temperature $T_{SET}$. The global power control operations correspond to a long power control loop intended to maintain an average power level at a power limit corresponding to the first threshold temperature $T_{SET}$.

Additionally, in some situations, the burst of instructions occurs to a specific processor 204 in a first domain 502 as well. A local power profile 606 of the first domain 502 is obtained based on a first subset of the plurality of power values collected at the first domain 502. A predefined temperature increase limit ΔT' in the predefined window size $L_W$ also corresponds to an upper limit for a tolerable burst of instructions of the processor 204. In some implementations, the predefined temperature increase limit ΔT' is programmable. Beyond the predefined temperature increase limit ΔT', prompt local power control operations (e.g., throttling actions) need to be applied to the first domain. In some implementations, a first temperature value $T_1'$ and a second temperature value $T_2'$ are identified on the local power profile 606, and correspond to a start and an end of a time window having the predefined window size $L_W$ on the local power profile 606, respectively. The first temperature value $T_1'$ is optionally equal to the first threshold temperature $T_{SET}$, while the second temperature value $T_2'$ is less than the second threshold temperature $T_{TH}$. A temperature difference is determined between the first and second temperature values and compared with the predefined temperature increase limit ΔT', indicating whether a power surge occurs to the processor 204 on the first domain 502. If the temperature difference exceeds the predefined temperature increase limit, a local power control operation (e.g., a power throttling action) is applied to the processor 204 of the first domain on the hardware level.

The system temperature profiles 602 and 604 and local temperature profile 606 do not reflect real-time power consumption performance of a corresponding processor system, because a temperature response is always delayed from a power consumption or current experienced by and measured from the processor system. In some implementations not shown in FIG. 6, a system power profile is generated to monitor power consumption or current values of an SoC over a time duration directly, and a local power profile is generated to monitor power consumption or current values of a first domain (e.g., a processor 204) over a time duration directly. A power consumption or current increase (e.g., from $P_1$ to $P_2$, from $I_1$ to $I_2$) is monitored within the predefined window size $L_W$ to determine whether to initiate local power control operations (e.g., hard throttling) on a subset of domains or the first domain. Also, second and third criteria that are based on temperature are adjusted to be based on power consumption and current levels indicated by the system power profile. The second criterion is not as critical as the third criterion, and the corresponding power consumption and current levels allow "soft" throttling initiated from the firmware level. In contrast, the third criterion triggers "hard" throttling on the hardware level, thereby controlling the power consumption and current levels below an upper limit at a much faster rate than "soft" throttling.

In some situations, prior to the first time $t_1$, the temperature value of the system temperature profile is compared with the first threshold temperature $T_{SET}$ constantly according to a temperature monitoring frequency. After the first time $t_1$, such a comparison at the temperature monitoring frequency is suspended, while a comparison with the second threshold temperature $T_{TH}$ occurs with the predefined controlling frequency. In some implementations, when the respective system temperature value drops below the first temperature threshold $T_{TH}$, the comparison operation is resumed, i.e., the temperature value of the system temperature profile is compared again with the first threshold temperature $T_{SET}$ constantly according to the temperature monitoring frequency. Also, when the respective system temperature value is below the first temperature threshold $T_{TH}$, the temperature value of the system temperature profile is not compared with the second threshold temperature $T_{TH}$ according to the predefined controlling frequency.

It is noted that the plurality of power samples are collected from the first domain according to a local sampling rate (e.g., every 10 μs). Each system temperature value is combined from a respective subset of power samples of the plurality of domains according to a global pooling rate (e.g., every 100 μs). The local sampling rate is greater than the global pooling rate, and the global pooling rate is greater than the predefined controlling frequency (e.g., every 500 μs).

Figure 7:
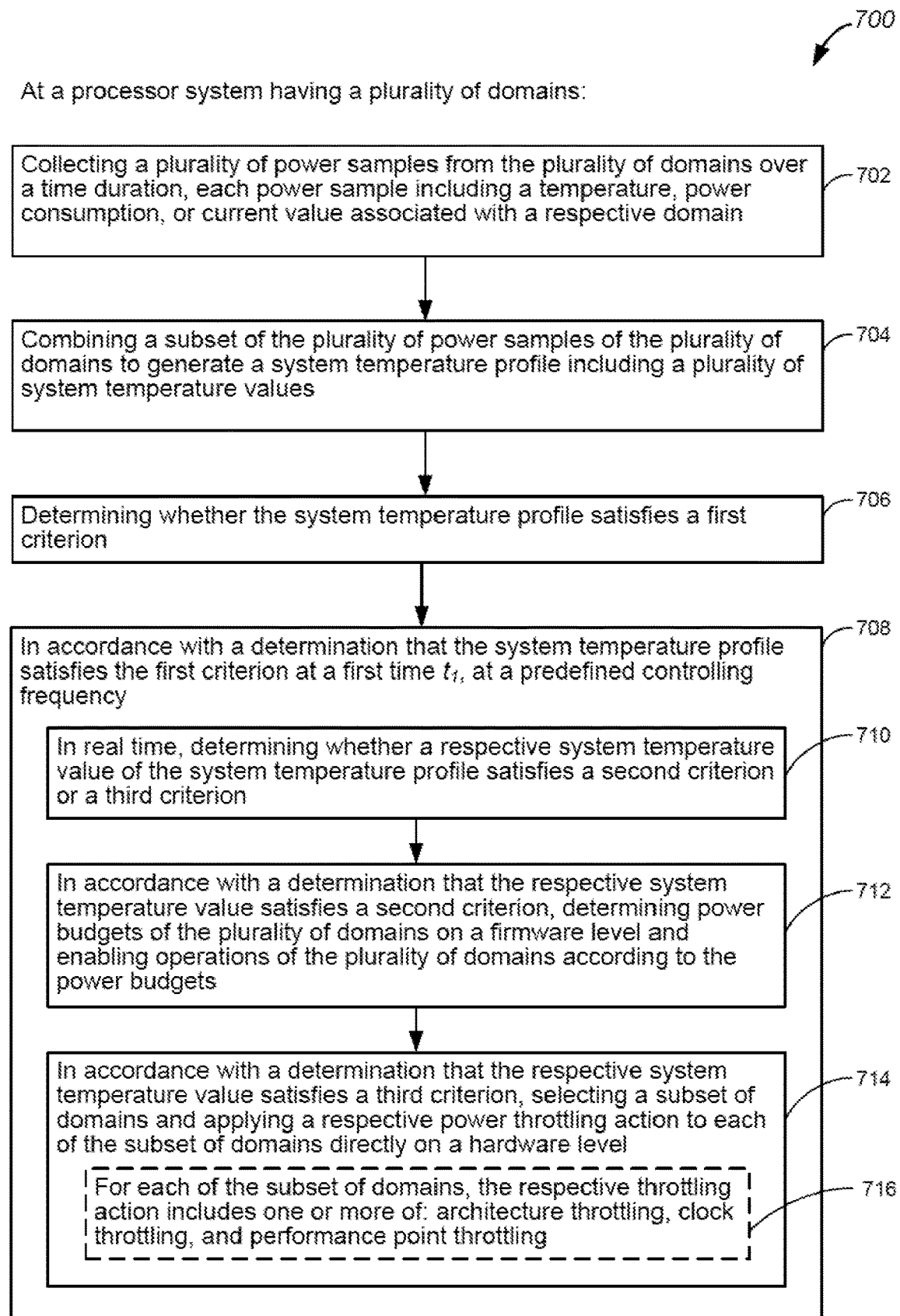
FIG. 7 is a flow diagram of a method of managing power consumption of an SoC-based electronic device, in accordance with some implementations.

FIG. 7 is a flow diagram of a method 700 of managing power consumption of an SoC-based electronic device, in accordance with some implementations. The method 700 is implemented at a processor system having a plurality of domains. In some implementations, the processor system includes a plurality of processor units, one or more memory units, and power management integrated circuit (PMIC), and each of the plurality of domains includes a distinct subset of the processor system. A plurality of power samples are collected (702) from the plurality of domains over a time duration. Each power sample includes at least one of a temperature, power consumption, and current value associated with a respective domain. In an example, each power sample includes all of a temperature, power consumption, current value associated with a processor 204 at a specific time. Optionally, these power samples are measured by power sensors located at the plurality of domains and sent to a power management engine 210. Optionally, power samples measured by power sensors are preprocessed at the domains, a hub (e.g., a regional AMU 406B and a temperature sensor hub 408C in FIG. 4), or a global module 414, and the preprocessed power samples are sent to the power management engine 210. Optionally, a subset of the power samples are estimated, e.g., based on a set of power samples measured concurrently from adjacent power sensors or a history of power samples.

A subset of the plurality of power samples of the plurality of domains are combined (704) to generate a system temperature profile 602 including a plurality of system temperature values. The power management engine 210 determines (706) whether the system temperature profile 602 satisfies a first criterion. In accordance with a determination (708) that the system temperature profile 602 satisfies the first criterion at a first time $t_1$, at a predefined controlling frequency, the power management engine 210 determines (710) whether a respective system temperature value of the system temperature profile 602 satisfies a second criterion or a third criterion in real time. In some implementations, the respective system temperature value belongs to a temporally-ordered sequence of system temperature values that are monitored subsequently to the first time $t_1$ on the system temperature profile 602 according to the predefined controlling frequency.

In accordance with a determination that the respective system temperature value satisfies a second criterion, the power management engine 210 determines (712) power budgets of the plurality of domains on a firmware level and enabling operations of the plurality of domains according to the power budgets. In some implementations, these operations include power throttling actions implemented on individual domains, and however, are initiated on the firmware level and correspond to long control loops, e.g., in a global power control operation 608A or 608B in FIG. 6. In accordance with a determination that the respective system temperature value satisfies a third criterion, the power management engine 210 selects (714) a subset of domains and enables a respective power throttling action to each of the subset of domains directly on a hardware level. This power throttling action is initiated directly on the hardware level and correspond to a short control loop, e.g., in a local power control operation 610 in FIG. 6. Specifically, in some implementations, for each of the subset of domains, the respective throttling action includes (716) one or more of: architecture throttling, power rail scaling, and clock throttling. Architecture throttling is applied to periodically block traffic to the respective domain including DRAM or suppress high current spikes in the respective domain including a processor unit. Clock throttling is applied to reduce a clock frequency of the respective domain. Performance point throttling is applied to adjust the clock frequency and power supply voltages of the respective domain jointly.

In some implementations, a first temperature value $T_1$ and a second temperature value $T_2$ are identified on the system temperature profile 604, and correspond to a start and an end of a time window having a predefined window size $L_W$, respectively. The power management engine 210 determines a temperature difference between the first and second temperature values and whether the temperature difference exceeds a predefined temperature increase limit. In some implementations, the predefined temperature increase limit is programmable. In accordance with a determination that the temperature difference exceeds the predefined temperature increase limit, which is optionally programmable, the subset of domains are selected to apply the respective power throttling action directly on the hardware level. The short control loops are applied to suppress the temperature increase, thereby ensuring that the temperature value does not cross a maximal temperature $T_{MAX}$ within threshold duration of time $W_T$ subsequent to the first time $t_1$.

Alternatively, in some implementations, a first power value $P_1$ or $I_1$ and a second power value $P_2$ or $I_2$ are identified on a system power profile of power consumption or current values of the processor system (e.g., an SoC 102), and correspond to a start and an end of a time window having a predefined window size $L_W$, respectively. The power management engine 210 determines a power difference between the first and second power values and whether the power difference exceeds a predefined power increase limit, which is optionally programmable. In accordance with a determination that the power difference exceeds the predefined power increase limit, the subset of domains are selected to apply the respective power throttling action directly on the hardware level. The short control loops are applied to suppress a power or current burst, thereby ensuring that the power consumption or current value does not cross a maximal power $P_{MAX}$ or $I_{MAX}$ within a threshold duration of time $W_T$ subsequent to the first time $t_1$.

In some implementations, a local power profile 606 is generated for a first domain (e.g., a processor 204) based on a first subset of the plurality of power values collected at the first domain. A first temperature value $T_1'$ and a second temperature value $T_2'$ are identified on the local power profile 606, and correspond to a start and an end of a time window having a predefined window size, respectively. A temperature difference is determined between the first and second temperature values $T_1'$ and $T_2'$ and compared with a predefined temperature increase limit. In some implementations, the predefined temperature increase limit is programmable. In accordance with a determination that the temperature difference exceeds the predefined temperature increase limit, a power throttling action is applied to the first domain directly on the hardware level. The short control loops are applied to suppress the temperature increase. Alternatively, in some implementations, the local power profile 606 is related to power consumption and current values of the first domain. A first power value $P_1'$ or $I_1'$ and a second power value $P_2'$ or $I_2'$ are identified on the local power profile 606, and correspond to a start and an end of a time window having a predefined window size, respectively. A power difference is determined between the first and second power values and compared with a predefined power increase limit, which is optionally programmable. In accordance with a determination that the power difference exceeds the predefined power increase limit, a power throttling action is applied to the first domain directly on the hardware level. The short control loops are applied to suppress the power consumption or current increase.

In some implementations, for each of the subset of domains, the respective throttling action is associated with a throttling threshold for a subset of power values corresponding to the respective domain. In accordance with a predefined power management policy, the power management engine 210 determines the throttling threshold associated with the respective throttling action of the respective domain on the firmware level. In accordance with a determination that the subset of power values of the respective domain exceeds the throttling threshold, the respective domain implements the respective throttling action on the hardware level.

In some implementations, the power management engine 210 determines a total power budget for the entire processor system and dynamically assigns a respective portion of the total power budget to each of the plurality of domains. The power budgets of the domains are redistributed based on activity levels of the domains on the firmware level, and each domain is instructed to adjust its operation locally on the hardware level according to the assigned portion of the total power budget.

In some implementations, based on the respective system temperature value, one of a plurality of predefined power performance states (P-states) is selected for each of a plurality of processors, and each of the P-states corresponds to a predefined set of power and performance settings of the processors. The power budgets are redistributed among the plurality of domains according to the predefined set of power and performance settings of the selected P-state for each of the plurality of processors.

In some implementations, the first criterion requires that the system temperature profile increases to and beyond a first temperature threshold $T_{SET}$ at a corresponding time. The second criterion requires that a system temperature value at a corresponding time is between the first temperature threshold $T_{SET}$ and a second temperature threshold $T_{TH}$. The third criterion requires that a system temperature value at a corresponding time is greater than the second temperature threshold $T_{TH}$ or that the system temperature value stays above the first temperature threshold $T_{SET}$ for an extended time longer than a threshold duration of time. The first temperature threshold $T_{SET}$ is less than the second temperature threshold $T_{TH}$, the second temperature threshold $T_{TH}$ less than a maximal temperature $T_{MAX}$ below which the processor system is controlled.

In some implementations, prior to the first time $t_1$, whether the system temperature profile satisfies the first criterion is monitored according to a temperature monitoring frequency. After the first time $t_1$, the power management engine 210 suspends determining whether the system temperature profile satisfies the first criterion according to the temperature monitoring frequency. In accordance with a determination that the respective system temperature value is below the first temperature threshold $T_{TH}$, the power management engine 210 resumes determining whether the system temperature profile satisfies the first criterion according to the temperature monitoring frequency, and aborts determining whether the respective system temperature value satisfies the second and third criteria according to the predefined controlling frequency.

In some implementations, the plurality of power samples are collected from the plurality of domains according to a local sampling rate. Each system temperature value is combined from a respective subset of power samples of the plurality of domains according to a global pooling rate. The local sampling rate is greater than the global pooling rate, and the global pooling rate is greater than the predefined controlling frequency.

In some implementations, each domain is powered by one or more power rails that are driven by PMIC. For each power rail, a respective set of current values are collected for each power rail. In accordance with a determination that the respective set of current values have been greater than a first threshold current for a first duration of time (e.g., $1.35 I_{CC,nom}$ for 300-400 μs) greater than a second threshold current for a second duration of time (e.g., $1.2 I_{CC,nom}$ for 1 ms), a power throttling action is implemented on the respective power rail of the respective domain. The first threshold current is greater than the second threshold current, and the first duration of time is shorter than the second duration of time.

Temperature profiles do not reflect real-time power consumption or current performance of a processor system, because a temperature response is delayed from power consumption or current values experienced by and measured from the processor system. In some situations, a power management method is implemented to manage power of a processor system having a plurality of domains based on a system power profile directly. The system power profile include a plurality of system power values that are not limited to temperature values and may be current values or power consumption values. A plurality of power samples are collected from the plurality of domains over a time duration. Each power sample includes at least one of temperature, power consumption, and current value associated with a respective domain. A subset of the plurality of power samples of the plurality of domains are combined to generate a system power profile including a plurality of system power values (power consumptions or current values). A power management engine determines whether the system power profile satisfies a first criterion. In accordance with a determination that the system power profile satisfies the first criterion at a first time $t_1$, the power management engine determines, at a predefined controlling frequency and in real time, whether a respective system power value of the system power profile satisfies a second criterion or a third criterion. In accordance with a determination that the respective system power value satisfies the second criterion, the power management engine determines power budgets of the plurality of domains on a firmware level, and enables operations of the plurality of domains according to the power budgets. In some embodiments, such operations my include throttling actions. In accordance with a determination that the respective system power value satisfies the third criterion, the power management engine determines selects a subset of domains and applies a respective power throttling action to each of the subset of domains on a hardware level.

The first criterion is associated with initiation of a critical performance regime in which power performance of the processor system needs to be closely monitored. Both the second and second criteria are more critical than the first criterion, while the second criterion is not as critical as the third criterion. When the second criterion is satisfied, head room from a performance limit (e.g., a maximal temperature $T_{MAX}$, a largest power burst) is still available, allowing the power management engine 210 to apply the global power control operation to control the power performance of the processor system using "soft" throttling from the firmware level. In contrast, when the third criterion is satisfied, the head room from the performance limit is limited, and "hard" throttling actions have to be taken directly in the hardware level to reduce temperature, power consumption or current values immediately on individual domains. The first rate of firmware-level "soft" throttling (e.g., ~1 ms) is not as fast as the second rates of the hardware-level "hard" throttling actions (e.g., ~50-100 μs). As such, "soft" or "hard" throttling actions can be applied based on an urgency level of a power condition of the processor system as indicated by the system power profile (e.g., the system temperature profile 602 and 604).

Different types of temperature, power consumption, and current profiles can be monitored jointly to control temperature, power consumption, and/or current performance of individual domains, a region of domains, or a processor system. In some implementations, referring to FIG. 6, a system or local temperature profile is monitored to control temperature, power consumption, and/or current performance of a processor system (e.g., an SoC 102) or a domain (e.g., a processor 204), respectively. In some implementations, a power consumption or current profile is monitored for the processor system or individual domain to control power consumption and current performance of the processor system or individual. Optionally, a power consumption profile is monitored to control the power consumption performance of the processor system or individual domain directly and without involving monitoring of temperature or current values. Optionally, a current profile is monitored to control the current performance of the processor system or individual domain directly and without involving monitoring of temperature or power consumption.

Figure 8:
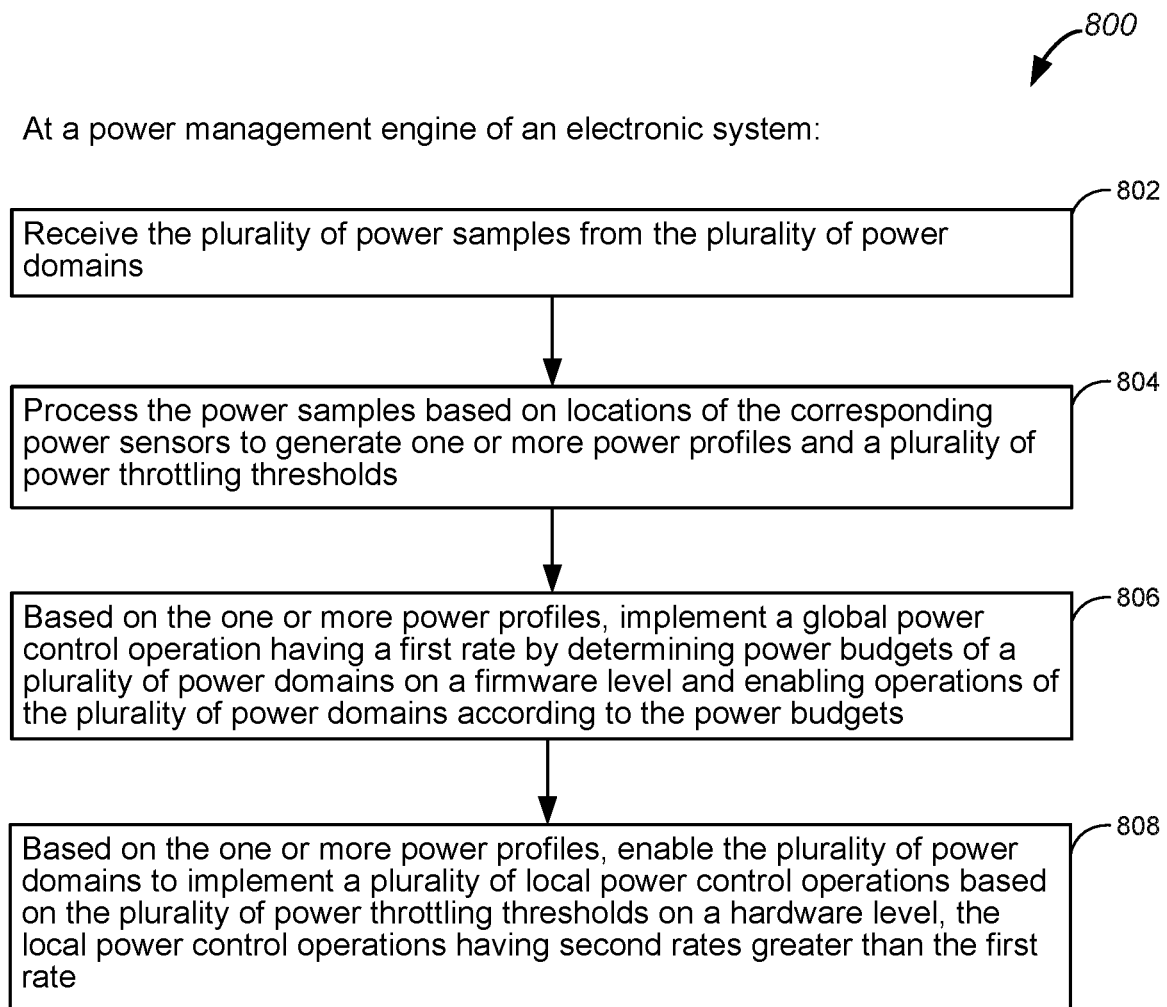
FIG. 8 is a flow diagram of a method of managing power consumption of an SoC-based electronic device, in accordance with some implementations.

FIG. 8 is a flow diagram of a method 800 of managing power consumption of an SoC-based electronic device, in accordance with some implementations. The method 800 is implemented at a power management engine of an electronic system. In some implementations, the processor system includes a plurality of processor units, one or more memory units, and power management integrated circuit (PMIC), and each of the plurality of domains includes a distinct subset of the processor system. A plurality of power samples are received (802) from the plurality of domains over a time duration. Each power sample includes at least one of a temperature, power consumption, and current value associated with a respective domain. In an example, each power sample includes all of a temperature, power consumption, current value associated with a processor 204 at a specific time. Optionally, these power samples are measured by power sensors located at the plurality of domains and sent to a power management engine 210. Optionally, power samples measured by power sensors are preprocessed at the domains, a hub (e.g., a regional AMU 406B and a temperature sensor hub 408C in FIG. 4), or a global module 414, and the preprocessed power samples are sent to the power management engine 210. Optionally, a subset of the power samples are estimated, e.g., based on a set of power samples measured concurrently from adjacent power sensors or a history of power samples.

The power samples are processed (804) based on locations of the corresponding power sensors to generate one or more power profiles (e.g., profiles 602-606 in FIG. 6) and a plurality of power throttling thresholds. Based on the one or more power profiles, a global power control operation having a first rate is implemented (806) by determining power budgets of a plurality of power domains on a firmware level and enabling operations of the plurality of power domains according to the power budgets. Based on the one or more power profiles, the plurality of power domains are enabled (808) to implement a plurality of local power control operations based on the plurality of power throttling thresholds on a hardware level. The local power control operations have second rates greater than the first rate.

In some implementations, each processor cluster 202 includes one or more respective processors 204 and a cluster cache 206. The first memory 208 is coupled to the one or more processing clusters to receive data access requests from the one or more processor clusters 202. The PMIC is configured to provide a plurality of power rails to the one or more processor clusters 202 and second memory 104. The second memory 104 is configured to receive data retrieval requests from the plurality of processing clusters 202 to the first memory 208 that are not satisfied by the first memory 208. The plurality of power sensors 408 include a plurality of temperature sensors for measuring temperature values and a plurality of activity monitor units (AMUs) 406 for measuring power consumption and current values.

In some implementations, each of the power domains includes a distinct subset of the one or more processor clusters 202, first memory 208, PMIC 118, and second memory 104. Each local power control operation is configured to be implemented on a respective power domain based on a corresponding local power profile generated from a subset of power samples collected by a subset of power sensors disposed on the respective power domain. The respective power domain is configured to receive a respective power throttling threshold from the power management engine 210. The one or more power profiles include the corresponding local power profile.

In some implementations, the one or more processor clusters 202 and first memory 208 are integrated on a system on a chip (SoC) 102, and the SoC 102 is integrated with the PMIC 118 in an integrated semiconductor device 300.

In some implementations, each domain is driven by one or more power rails. For each power rail, a respective set of current values is collected. In accordance with a determination that the respective set of current values have been greater than a first threshold current for a first duration of time or greater than a second threshold current for a second duration of time, a power throttling action is enabled on the respective power rail of the respective domain. The first threshold current is greater than the second threshold current, and the first duration of time is shorter than the second duration of time.

It should be understood that the particular order in which the operations in FIGS. 7 and 8 have been described are merely exemplary and are not intended to indicate that the described order is the only order in which the operations could be performed. One of ordinary skill in the art would recognize various ways to manage power consumption of an SoC-based electronic device 200 as described herein. Additionally, it should be noted that details of other processes described above with respect to FIGS. 1-6 are also applicable in an analogous manner to method 700 or 800 described above with respect to FIG. 7 or 8. For brevity, these details are not repeated here.

Implementation examples are described in at least the following numbered clauses:

Clause 1. An electronic system, comprising: one or more processor clusters and first memory; power management integrated circuit (PMIC); second memory coupled to the one or more processing clusters; a plurality of power sensors distributed on the electronic system, wherein the power sensors are configured to collect a plurality of power samples from a plurality of power domains of the electronic system, each power sample including at least one of temperature, power consumption, and current values associated with a respective power domain; and a power management engine coupled to the plurality of power sensors, wherein the power management engine is configured to: (1) receive the plurality of power samples from the plurality of power domains; (2) process the power samples based on locations of the corresponding power sensors to generate one or more power profiles and a plurality of power throttling thresholds; (3) based on the one or more power profiles, implement a global power control operation having a first rate by determining power budgets of a plurality of power domains on a firmware level and enabling operations of the plurality of power domains according to the power budgets; and (4) based on the one or more power profiles, enable the plurality of power domains to implement a plurality of local power control operations based on the plurality of power throttling thresholds on a hardware level, the local power control operations having second rates greater than the first rate.

Clause 2. The electronic system of claim 1, wherein: each processor cluster includes one or more respective processors and a cluster cache; the first memory coupled to the one or more processing clusters to receive data access requests from the one or more processor clusters; the PMIC is configured to provide a plurality of power rails to the one or more processor clusters and second memory; the second memory is configured to receive data retrieval requests from the plurality of processing clusters to the first memory that are not satisfied by the first memory; the plurality of power sensors include a plurality of temperature sensors for measuring temperature values and a plurality of activity monitor units (AMUs) for measuring power consumption and current values.

Clause 3. The electronic system of claim 1 or 2, wherein: each of the power domains includes a distinct subset of the one or more processor clusters, first memory, PMIC, and second memory; and each local power control operation is configured to be implemented on a respective power domain based on a corresponding local power profile generated from a subset of power samples collected by a subset of power sensors disposed on the respective power domain, the respective power domain configured to receive a respective power throttling threshold from the power management engine, the one or more power profiles including the corresponding local power profile.

Clause 4. The electronic system of any of claims 1-3, wherein the one or more processor clusters and first memory are integrated on a system on a chip (SoC), and the SoC is integrated with the PMIC in an integrated semiconductor device.

Clause 5. The electronic system of claim 4, wherein the integrated semiconductor device, second memory, and power management engine are assembled on a main circuit broad.

Clause 6. The electronic system of claim 4 or 5, wherein the main circuit broad further includes one or more of: a system control, manageability and debug (CMD) component, a security processor, and an input/output (IO) controller.

Clause 7. The electronic system of any of claims 1-6, wherein each domain is driven by one or more power rails, the power management engine is configured to for each power rail, collect a respective set of current values; and in accordance with a determination that the respective set of current values have been greater than a first threshold current for a first duration of time or greater than a second threshold current for a second duration of time, enable a power throttling action on the respective power rail of the respective domain; wherein the first threshold current is greater than the second threshold current, and the first duration of time is shorter than the second duration of time.

Clause 8. The electronic system of any of claims 1-7, wherein: each throttling action includes one or more of: architecture throttling, power rail scaling, and clock throttling; architecture throttling is applied to periodically block traffic to the respective domain including DRAM or suppress high current spikes in the respective domain including a processor unit; clock throttling is applied to reduce a clock frequency of the respective domain; and performance point throttling is applied to adjust the clock frequency and power supply voltages of the respective domain jointly.

Clause 9. The electronic system of any of claims 1-8, wherein each throttling action is associated with a throttling threshold for a subset of power values corresponding to the respective domain, the power management engine is configured to in accordance with a predefined power management policy, determine the throttling threshold associated with the respective throttling action of the respective domain, thereby allowing the respective domain to implement the respective throttling action in accordance with a determination that the subset of power values of the respective domain exceeds the throttling threshold.

Clause 10. The electronic system of any of claims 1-9, determining the power budgets of the plurality of power domains on the firmware level further comprising: selecting one of a plurality of predefined power performance states (P-states) for each of a plurality of processors, each of the P-states corresponding to a predefined set of power and performance settings of the processors.

Clause 11. The electronic system of any of claims 1-10, wherein: the one or more power profiles include a system power profile tracking an average power consumption or an average total current of a subset or all of the plurality of power domains of the electronic system; and the power management engine is configured to in accordance with the system power profile, enable the global power control operation and the plurality of local power control operations based on a requirement for a power control rate, the first rate of the global power control operation, and the second rates of the local power control operations, such that the system power profile is controlled below a predefined upper limit for the subset or all of the plurality of power domains of the electronic system.

Clause 12. The electronic system of any of claims 1-11, wherein: the one or more power profiles include a local current profile tracking a current of a first power domain; and the power management engine is configured to in accordance with the local current profile, enable the global power control operation and a local power control operation focused on the first power domain based on a requirement for a power control rate, the first rate of the global power control operation, and the second rates of the local power control operations, such that the local current profile is controlled below a predefined current limit for the first power domain.

Clause 13. A method implemented by a power management engine of an electronic system having one or more processor clusters and first memory, power management integrated circuit (PMIC), second memory coupled to the one or more processing clusters, a plurality of power sensors distributed on the electronic system, and a power management engine coupled to the plurality of power sensors, wherein the power sensors are configured to collect a plurality of power samples from a plurality of power domains of the electronic system, each power sample including at least one of temperature, power consumption, and current values associated with a respective power domain, the method comprising receiving the plurality of power samples from the plurality of power domains; processing the power samples based on locations of the corresponding power sensors to generate one or more power profiles and a plurality of power throttling thresholds; based on the one or more power profiles, implementing a global power control operation having a first rate by determining power budgets of a plurality of power domains on a firmware level and enabling operations of the plurality of power domains according to the power budgets; and based on the one or more power profiles, enabling the plurality of power domains to implement a plurality of local power control operations based on the plurality of power throttling thresholds on a hardware level, the local power control operations having second rates greater than the first rate.

Clause 14. The electronic system of claim 13, wherein: each processor cluster includes one or more respective processors and a cluster cache; the first memory coupled to the one or more processing clusters to receive data access requests from the one or more processor clusters; the PMIC is configured to provide a plurality of power rails to the one or more processor clusters and second memory; the second memory is configured to receive data retrieval requests from the plurality of processing clusters to the first memory that are not satisfied by the first memory; the plurality of power sensors include a plurality of temperature sensors for measuring temperature values and a plurality of activity monitor units (AMUs) for measuring power consumption and current values.

Clause 15. The electronic system of claim 13 or 14, wherein: each of the power domains includes a distinct subset of the one or more processor clusters, first memory, PMIC, and second memory; and each local power control operation is configured to be implemented on a respective power domain based on a corresponding local power profile generated from a subset of power samples collected by a subset of power sensors disposed on the respective power domain, the respective power domain configured to receive a respective power throttling threshold from the power management engine, the one or more power profiles including the corresponding local power profile.

Clause 16. The electronic system of any of claims 13-15, wherein the one or more processor clusters and first memory are integrated on a system on a chip (SoC), and the SoC is integrated with the PMIC in an integrated semiconductor device.

Clause 17. The electronic system of claim 16, wherein the integrated semiconductor device, second memory, and power management engine are assembled on a main circuit broad.

Clause 18. The electronic system of claim 16 or 17, wherein the main circuit broad further includes one or more of: a system control, manageability and debug (CMD) component, a security processor, and an input/output (IO) controller.

Clause 19. The electronic system of any of claims 13-18, wherein each domain is driven by one or more power rails, the power management engine is configured to for each power rail, collect a respective set of current values; and in accordance with a determination that the respective set of current values have been greater than a first threshold current for a first duration of time or greater than a second threshold current for a second duration of time, enable a power throttling action on the respective power rail of the respective domain; wherein the first threshold current is greater than the second threshold current, and the first duration of time is shorter than the second duration of time.

Clause 20. The electronic system of any of claims 13-19, wherein: each throttling action includes one or more of: architecture throttling, power rail scaling, and clock throttling; architecture throttling is applied to periodically block traffic to the respective domain including DRAM or suppress high current spikes in the respective domain including a processor unit; clock throttling is applied to reduce a clock frequency of the respective domain; and performance point throttling is applied to adjust the clock frequency and power supply voltages of the respective domain jointly.

Clause 21. The electronic system of any of claims 13-20, wherein each throttling action is associated with a throttling threshold for a subset of power values corresponding to the respective domain, the power management engine is configured to in accordance with a predefined power management policy, determine the throttling threshold associated with the respective throttling action of the respective domain, thereby allowing the respective domain to implement the respective throttling action in accordance with a determination that the subset of power values of the respective domain exceeds the throttling threshold.

Clause 22. The electronic system of any of claims 13-21, determining the power budgets of the plurality of power domains on the firmware level further comprising: selecting one of a plurality of predefined power performance states (P-states) for each of a plurality of processors, each of the P-states corresponding to a predefined set of power and performance settings of the processors.

Clause 23. The electronic system of any of claims 13-22, wherein: the one or more power profiles include a system power profile tracking an average power consumption or an average total current of a subset or all of the plurality of power domains of the electronic system; and the power management engine is configured to in accordance with the system power profile, enable the global power control operation and the plurality of local power control operations based on a requirement for a power control rate, the first rate of the global power control operation, and the second rates of the local power control operations, such that the system power profile is controlled below a predefined upper limit for the subset or all of the plurality of power domains of the electronic system.

Clause 24. The electronic system of any of claims 13-23, wherein: the one or more power profiles include a local current profile tracking a current of a first power domain; and the power management engine is configured to in accordance with the local current profile, enable the global power control operation and a local power control operation focused on the first power domain based on a requirement for a power control rate, the first rate of the global power control operation, and the second rates of the local power control operations, such that the local current profile is controlled below a predefined current limit for the first power domain.

Clause 25. A non-transitory computer-readable storage medium of an electronic system having one or more processor clusters and first memory, power management integrated circuit (PMIC), second memory coupled to the one or more processing clusters, a plurality of power sensors distributed on the electronic system, and a power management engine coupled to the plurality of power sensors, wherein the power sensors are configured to collect a plurality of power samples from a plurality of power domains of the electronic system, each power sample including at least one of temperature, power consumption, and current values associated with a respective power domain, the non-transitory computer-readable storage medium having instructions stored thereon, which when executed by the power management engine cause the power management engine to perform any of the method in any of clauses 13-24.

Clause 26. An apparatus for managing power at an electronic system having one or more processor clusters and first memory, power management integrated circuit (PMIC), second memory coupled to the one or more processing clusters, a plurality of power sensors distributed on the electronic system, and a power management engine, wherein the power sensors are configured to collect a plurality of power samples from a plurality of power domains of the electronic system, each power sample including at least one of temperature, power consumption, and current values associated with a respective power domain, and the power management engine is coupled to the plurality of power sensors, the apparatus comprising means for performing any of the method in any of clauses 13-24.

The terminology used in the description of the various described implementations herein is for the purpose of describing particular implementations only and is not intended to be limiting. As used in the description of the various described implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. Additionally, it will be understood that, although the terms "first," "second," etc. may be used herein to describe various elements, these elements should not be limited by these terms. These terms are only used to distinguish one element from another.

As used herein, the term "if" is, optionally, construed to mean "when" or "upon" or "in response to determining" or "in response to detecting" or "in accordance with a determination that," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]" or "in accordance with a determination that [a stated condition or event] is detected," depending on the context.

The foregoing description, for purpose of explanation, has been described with reference to specific embodiments. However, the illustrative discussions above are not intended to be exhaustive or to limit the claims to the precise forms disclosed. Many modifications and variations are possible in view of the above teachings. The embodiments were chosen and described in order to best explain principles of operation and practical applications, to thereby enable others skilled in the art.

Although various drawings illustrate a number of logical stages in a particular order, stages that are not order dependent may be reordered and other stages may be combined or broken out. While some reordering or other groupings are specifically mentioned, others will be obvious to those of ordinary skill in the art, so the ordering and groupings presented herein are not an exhaustive list of alternatives. Moreover, it should be recognized that the stages can be implemented in hardware, firmware, software or any combination thereof

What is claimed is:

1. An electronic system, comprising:
   one or more processor clusters and first memory;
   power management integrated circuit (PMIC);
   second memory coupled to the one or more processing clusters;

a plurality of power sensors distributed on the electronic system, wherein the power sensors are configured to collect a plurality of power samples from a plurality of power domains of the electronic system, each power sample including at least one of temperature, power consumption, and current values associated with a respective power domain; and a power management engine circuit coupled to the plurality of power sensors, wherein the power management engine circuit is configured to:
(1) receive the plurality of power samples from the plurality of power domains;
(2) process the power samples based on locations of the corresponding power sensors to generate one or more power profiles and a plurality of power throttling thresholds;
(3) based on the one or more power profiles, implement a global power control operation having a first rate by determining power budgets of a plurality of power domains on a firmware level and enabling operations of the plurality of power domains according to the power budgets; and
(4) based on the one or more power profiles, enable the plurality of power domains to implement a plurality of local power control operations based on the plurality of power throttling thresholds on a hardware level, the local power control operations having second rates greater than the first rate.

2. The electronic system of claim 1, wherein:
each processor cluster includes one or more respective processors and a cluster cache;
the first memory coupled to the one or more processing clusters to receive data access requests from the one or more processor clusters;
the PMIC is configured to provide a plurality of power rails to the one or more processor clusters and second memory;
the second memory is configured to receive data retrieval requests from the plurality of processing clusters to the first memory that are not satisfied by the first memory;
the plurality of power sensors include a plurality of temperature sensors for measuring temperature values and a plurality of activity monitor units (AMUs) for measuring power consumption and current values.

3. The electronic system of claim 1, wherein:
each of the power domains includes a distinct subset of the one or more processor clusters, first memory, PMIC, and second memory; and
each local power control operation is configured to be implemented on a respective power domain based on a corresponding local power profile generated from a subset of power samples collected by a subset of power sensors disposed on the respective power domain, the respective power domain configured to receive a respective power throttling threshold from the power management engine circuit, the one or more power profiles including the corresponding local power profile.

4. The electronic system of claim 1, wherein the one or more processor clusters and first memory are integrated on a system on a chip (SoC), and the SoC is integrated with the PMIC in an integrated semiconductor device.

5. The electronic system of claim 4, wherein the integrated semiconductor device, second memory, and power management engine circuit are assembled on a main circuit broad.

6. The electronic system of claim 5, wherein the main circuit broad further includes one or more of: a system control, manageability and debug (CMD) component, a security processor, and an input/output (IO) controller.

7. The electronic system of claim 1, wherein each domain is driven by one or more power rails, the power management engine circuit is configured to, for each power rail:
collect a respective set of current values; and
in accordance with a determination that the respective set of current values have been greater than a first threshold current for a first duration of time or greater than a second threshold current for a second duration of time, enable a power throttling action on the respective power rail of the respective domain;
wherein the first threshold current is greater than the second threshold current, and the first duration of time is shorter than the second duration of time.

8. The electronic system of claim 1, wherein:
each throttling action includes one or more of: architecture throttling, power rail scaling, and clock throttling;
architecture throttling is applied to periodically block traffic to the respective domain including DRAM or suppress high current spikes in the respective domain including a processor unit;
clock throttling is applied to reduce a clock frequency of the respective domain; and
performance point throttling is applied to adjust the clock frequency and power supply voltages of the respective domain jointly.

9. The electronic system of claim 1, wherein each throttling action is associated with a throttling threshold for a subset of power values corresponding to the respective domain, the power management engine circuit is configured to in accordance with a predefined power management policy, determine the throttling threshold associated with the respective throttling action of the respective domain, thereby allowing the respective domain to implement the respective throttling action in accordance with a determination that the subset of power values of the respective domain exceeds the throttling threshold.

10. The electronic system of claim 1, determining the power budgets of the plurality of power domains on the firmware level further comprising:
selecting one of a plurality of predefined power performance states (P-states) for each of a plurality of processors, each of the P-states corresponding to a predefined set of power and performance settings of the processors.

11. The electronic system of claim 1, wherein:
the one or more power profiles include a system power profile tracking an average power consumption or an average total current of a subset or all of the plurality of power domains of the electronic system; and
the power management engine circuit is configured to in accordance with the system power profile, enable the global power control operation and the plurality of local power control operations based on a requirement for a power control rate, the first rate of the global power control operation, and the second rates of the local power control operations, such that the system power profile is controlled below a predefined upper limit for the subset or all of the plurality of power domains of the electronic system.

12. The electronic system of claim 1, wherein:
the one or more power profiles include a local current profile tracking a current of a first power domain; and the power management engine circuit is configured to in accordance with the local current profile, enable the global power control operation and a local power control operation focused on the first power domain based on a requirement for a power control rate, the first rate of the global power control operation, and the second rates of the local power control operations, such that the local current profile is controlled below a predefined current limit for the first power domain.

13. The electronic system of claim 1, wherein based on the one or more power profiles, the power management engine circuit is configured to enable the global power control operation and the local power control operations to satisfy a requirement for a power control rate.

14. A method implemented by a power management engine of an electronic system having one or more processor clusters and first memory, power management integrated circuit (PMIC), second memory coupled to the one or more processing clusters, a plurality of power sensors distributed on the electronic system, and the power management engine coupled to the plurality of power sensors, wherein the power sensors are configured to collect a plurality of power samples from a plurality of power domains of the electronic system, each power sample including at least one of temperature, power consumption, and current values associated with a respective power domain, the method comprising:
receiving the plurality of power samples from the plurality of power domains;
processing the power samples based on locations of the corresponding power sensors to generate one or more power profiles and a plurality of power throttling thresholds;
based on the one or more power profiles, implementing a global power control operation having a first rate by determining power budgets of a plurality of power domains on a firmware level and enabling operations of the plurality of power domains according to the power budgets; and
based on the one or more power profiles, enabling the plurality of power domains to implement a plurality of local power control operations based on the plurality of power throttling thresholds on a hardware level, the local power control operations having second rates greater than the first rate.

15. The method of claim 14, wherein:
each processor cluster includes one or more respective processors and a cluster cache;
the first memory coupled to the one or more processing clusters to receive data access requests from the one or more processor clusters;
the PMIC is configured to provide a plurality of power rails to the one or more processor clusters and second memory;
the second memory is configured to receive data retrieval requests from the plurality of processing clusters to the first memory that are not satisfied by the first memory; and
the plurality of power sensors include a plurality of temperature sensors for measuring temperature values and a plurality of activity monitor units (AMUs) for measuring power consumption and current values.

16. The method of claim 14, wherein:
each of the power domains includes a distinct subset of the one or more processor clusters, first memory, PMIC, and second memory; and
each local power control operation is configured to be implemented on a respective power domain based on a corresponding local power profile generated from a subset of power samples collected by a subset of power sensors disposed on the respective power domain, the respective power domain configured to receive a respective power throttling threshold from the power management engine, the one or more power profiles including the corresponding local power profile.

17. The method of claim 14, wherein the one or more processor clusters and first memory are integrated on a system on a chip (SoC), and the SoC is integrated with the PMIC in an integrated semiconductor device.

18. The method of claim 14, wherein each domain is driven by one or more power rails, the method further comprising for each power rail:
collecting a respective set of current values; and
in accordance with a determination that the respective set of current values have been greater than a first threshold current for a first duration of time or greater than a second threshold current for a second duration of time, enabling a power throttling action on the respective power rail of the respective domain;
wherein the first threshold current is greater than the second threshold current, and the first duration of time is shorter than the second duration of time.

19. A non-transitory computer-readable storage medium of an electronic system having one or more processor clusters and first memory, power management integrated circuit (PMIC), second memory coupled to the one or more processing clusters, a plurality of power sensors distributed on the electronic system, and a power management engine coupled to the plurality of power sensors, wherein the power sensors are configured to collect a plurality of power samples from a plurality of power domains of the electronic system, each power sample including at least one of temperature, power consumption, and current values associated with a respective power domain, the non-transitory computer-readable storage medium having instructions stored thereon, which when executed by the power management engine cause the power management engine to perform:
receiving the plurality of power samples from the plurality of power domains;
processing the power samples based on locations of the corresponding power sensors to generate one or more power profiles and a plurality of power throttling thresholds;
based on the one or more power profiles, implementing a global power control operation having a first rate by determining power budgets of a plurality of power domains on a firmware level and enabling operations of the plurality of power domains according to the power budgets; and
based on the one or more power profiles, enabling the plurality of power domains to implement a plurality of local power control operations based on the plurality of power throttling thresholds on a hardware level, the local power control operations having second rates greater than the first rate.

* * * * *